(12) United States Patent
Song et al.

(10) Patent No.: US 7,465,595 B2
(45) Date of Patent: Dec. 16, 2008

(54) QUANTUM DEVICE, MANUFACTURING METHOD OF THE SAME AND CONTROLLING METHOD OF THE SAME

(75) Inventors: Haizhi Song, Kawasaki (JP); Tatsuya Usuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 356 days.

(21) Appl. No.: 11/064,497

(22) Filed: Feb. 24, 2005

(65) Prior Publication Data

US 2006/0099825 A1   May 11, 2006

(30) Foreign Application Priority Data

Nov. 9, 2004 (JP) ............................ 2004-325527
Dec. 14, 2004 (JP) ............................ 2004-361675

(51) Int. Cl.
*H01L 21/00* (2006.01)

(52) U.S. Cl. ........................... 438/46; 438/47; 438/962; 977/938

(58) Field of Classification Search ................. 438/766, 438/770, 478, 44, 42, 100, 101, 962, 83, 438/46, 47; 977/936–939
See application file for complete search history.

(56) References Cited

U.S. PATENT DOCUMENTS

| | | | | |
|---|---|---|---|---|
| 4,042,004 | A  * | 8/1977 | Kwan ............................. | 160/91 |
| 6,790,425 | B1 * | 9/2004 | Smalley et al. ............ | 423/447.1 |
| 6,978,020 | B2 * | 12/2005 | Taniguchi et al. ........... | 380/201 |
| 7,097,708 | B2 * | 8/2006 | Clark et al. ..................... | 117/94 |
| 7,135,697 | B2 * | 11/2006 | Friesen et al. .................. | 257/14 |
| 7,232,757 | B2 * | 6/2007 | Noguchi et al. .............. | 438/687 |
| 2004/0197070 | A1 * | 10/2004 | Takemoto et al. ............ | 385/147 |
| 2005/0067614 | A1 * | 3/2005 | Edamura ...................... | 257/14 |

FOREIGN PATENT DOCUMENTS

JP             4-273478             9/1992

(Continued)

OTHER PUBLICATIONS

Yoshuiro Utsumi, Indirect Exchange interaction between two quantum dots in an Aharonov-Bohm ring, Physical Review, Apr. 22, 2004.*

(Continued)

*Primary Examiner*—Kevin M Picardat
(74) *Attorney, Agent, or Firm*—Kratz, Quintos & Hanson, LLP

(57) ABSTRACT

By bringing a tip of an AFM into contact with the surface of a GaAs substrate or an AlGaAs substrate, for example, applying a negative bias to the tip, and applying a positive bias to the GaAs substrate or the AlGaAs substrate, a donut-shaped oxide film is formed. Then, the oxide film is removed. As a result, a ring-shaped groove is formed in the surface of the GaAs substrate or the AlGaAs substrate. The oxide film can be removed by chemical etching, ultrasonic cleaning with water, a treatment with atomic hydrogen in a vacuum, or the like. Thereafter, a semiconductor film (InAs film or InGaAs film, for example) is epitaxially grown in the groove. Then, a capping layer which covers the semiconductor film and the GaAs substrate or the AlGaAs substrate is formed.

27 Claims, 19 Drawing Sheets

FOREIGN PATENT DOCUMENTS

| | | |
|---|---|---|
| JP | 6-196720 | 7/1994 |
| JP | 2002-518851 | 6/2002 |
| JP | 2003-338618 | 11/2003 |
| WO | WO 99/66562 A1 | 12/1999 |

OTHER PUBLICATIONS

E. Kapon, et al; "Stimulated Emission in Semiconductor Quantum Wire Heterostructures;" *Physical Review Letters*; vol. 63; No. 4; Jul. 24, 1989; pp. 430-433 and Fig. 1 (5 Sheets).

R. Held, et al; "In-plane gates and nanostructures fabricated by direct oxidation of semiconductor heterostructures with an atomic force microscope;" *Applied Physics Letters*; vol. 73; No. 2; Jul. 13, 1998; pp. 262-264.

J.M. Garcia, et al.; "Intermixing and shape changes during the formation of InAs self-assembled quantum dots;" *Appl. Phys. Lett*; vol. 71; No. 14; Oct. 6, 1997; pp. 2014-2016.

T. Ohshima; "All-optical electron spin quantum computer with ancilla bits for operations in each coupled dot-cell;" *Physical Review A*; vol. 62; 2000; pp. 062316-1-062316-6.

I.L. Chuang, et al; "Experimental realization of a quantum algorithm;" *Nature*; vol. 393; May 14, 1998; pp. 143-146.

B.E. Kane; "A silicon-based nuclear spin quantum computer;" *Nature*; vol. 393; May 14, 1998; pp. 133-137.

Song et al; "Growth process of quantum dots precisely controlled by an AFM-assisted technique"; Physica E 21 (2004) pp. 625-630.

Hasegawa et al; "Hexagonal binary decision diagram quantum logic circuits using Schottky in-plane and wrap-gate control of GaAs and InGaAs nanowires"; Physica E 11 (2001) pp. 149-154.

* cited by examiner

QUANTUM DEVICE, MANUFACTURING METHOD OF THE SAME AND CONTROLLING METHOD OF THE SAME

CROSS-REFERENCE TO RELATED APPLICATIONS

This application is based upon and claims the benefit of priority from the prior Japanese Patent Applications No. 2004-325527, filed on Nov. 9, 2004, and No. 2004-361675, filed on Dec. 14, 2004, the entire contents of which are incorporated herein by reference.

BACKGROUND OF THE INVENTION

1. Field of the Invention

The present invention relates to a quantum device including a quantum ring, a manufacturing method of the same and a controlling method of the same.

2. Description of the Related Art

Recently, studies of a quantum device as a promising candidate for future electronic and optoelectronic devices have been made. Most of these studies have been made on a quantum well, a quantum wire, and a quantum dot. A study on a quantum ring has been also made. For example, in Patent Document 3, a quantum ring with a ring diameter of 0.3 μm is proposed. However, if the application thereof to a quantum computer is considered, the quantum ring needs to be small to such an extent that a single carrier can be confined therein. As the size of the quantum ring becomes smaller, the quantum ring becomes more widely applicable.

Incidentally, even now, it is possible to fabricate a split-gate structure quantum ring with a diameter of approximately hundreds of nanometers on a two-dimensional electron gas. For example, in Non-Patent Document 2, a quantum ring fabricated by partial oxidation with lithography technology using an atomic force microscope (AFM) is described. However, such a quantum ring depends on the two-dimensional electron gas under the surface, and its quantum effect is small, so that its application range is narrow.

In Non-Patent Document 3, a method in which a quantum ring is fabricated by a method similar to that of a self-assembled semiconductor quantum dot is described. It is noted that in this method, after a very thin capping layer is formed, post annealing is performed. The size of a quantum ring obtained by this method is several times larger than the self-assembled semiconductor quantum dot, the spatial distribution is random, and the size fluctuation is larger. Hence, it is of little practical use.

On the other hand, in Patent Document 4, a method of forming a quantum dot in a desired size at a desired position with AFM lithography technology is described.

However, even if any of the prior arts is adopted or any of the prior arts is referred to, the quantum ring cannot be formed in the desired size at the desired position.

Moreover, various methods of forming a qubit (quantum bit) composing a quantum computer have been studied. Further, a nuclear spin is desirable as a candidate for the qubit. This is because its decoherence time is as long as $10^{-2}$ seconds to $10^8$ seconds. Therefore, a nuclear spin qubit in a liquid state is studied (Non-Patent Document 7). In this document, it is described that in a solvent in which a molecule containing a number of atoms with a nuclear spin ½ (for example, $^1H$, $^{13}C$, $^{19}F$, $^{15}N$, and $^{31}P$) is dissolved, nuclear magnetic resonance (NMR) is performed as the manipulation of a nuclear spin quantum computer. Each of the atoms with a nuclear spin ½ acts as a qubit. In a molecule, atoms in different sites differ in resonant frequency, so that each qubit can be independently manipulated. This technique makes quantum Fourier transform and factorization of a small prime number possible. However, a device in a liquid state is difficult to be scalable.

Hence, a nuclear spin qubit in a solid state is required. For example, in Non-Patent Document 8, a Si-based nuclear spin quantum computer is proposed. In the quantum computer, using a $^{31}P$ atom with a nuclear spin ½ in $^{28}Si$ as a qubit, the nuclear spin is rotated by combining the application of an electrostatic field and a resonant radio frequency (rf). A quantum gate composed of two qubits is implemented by combining electrostatic gates on the neighboring $^{31}P$ atoms and resonant radio frequencies.

However, in such a quantum computer, it is difficult to precisely manipulate electron clouds using the electrostatic gates. Further, it is extremely difficult to precisely place one nuclear spin atom in each qubit.

(Patent Document 1)
Japanese Patent Application Laid-open No. Hei 6-196720
(Patent Document 2)
Translated National Publication of Patent Application No. 2002-518851
(Patent Document 3)
Japanese Patent Application Laid-open No. Hei 4-273478
(Patent Document 4)
Japanese Patent Application Laid-open No. 2003-338618
(Non-Patent Document 1)
E. Kapon et al., Phys. Rev. Lett 63, 430 (1989) (Non-Patent Document 2)
R. Held et al., Appl. Phys. Lett. 73, 262 (1998) (Non-Patent Document 3)
J. M. Garcia et al. Appl. Phys. Lett. 71, 2014 (1997)
(Non-Patent Document 4)
H. Hasegawa and S. Kasai, Physics E 11, 371 (2001)
(Non-Patent Document 5)
H. Z. Song et al., Phys. E 21, 625 (2004)
(Non-Patent Document 6)
T. Ohshima, Phys. Rev. A 62, 062316 (2000)
(Non-Patent Document 7)
I. L. Chuang et al., Nature 393, 143 (1998)
(Non-Patent Document 8)
B. E. Kane, Nature 393, 133 (1998)

SUMMARY OF THE INVENTION

A first object of the present invention is to provide a quantum device capable of placing a quantum ring in a desired size at a desired position and a manufacturing method of the same. A second object of the present invention is to provide a easily controllable quantum device even in a solid state, a controlling method of the same and a manufacturing method of the same.

As a result of assiduous studies to solve the aforementioned problems, the inventor of the present application has reached various aspects of the invention described below.

In a first manufacturing method of a quantum device according to the present invention, after a tip of an atomic force microscope to which a negative bias is applied is brought into contact with a surface of a semiconductor substrate to form a ring-shaped oxide film on the surface of the semiconductor substrate in an atmosphere containing water, a ring-shaped groove is formed in the surface of the semiconductor substrate by removing the oxide film. Then, a semiconductor film is grown in the groove.

In a second manufacturing method of a quantum device according to the present invention, after impurity atoms are introduced into a surface of a semiconductor substrate, a tip of an atomic force microscope to which a negative bias is applied is brought into contact with the surface of the semiconductor substrate to form a ring-shaped oxide film and a plurality of dot-shaped oxide films on the surface of the semiconductor substrate in an atmosphere containing water. Then, portions around the ring-shaped oxide film and the dot-shaped oxide films are oxidized. Subsequently, a ring-shaped groove and dot-shaped pits are formed in the surface of the semiconductor substrate by removing the ring-shaped oxide film and the dot-shaped oxide films and removing the oxidized portions therearound. Thereafter, semiconductor films in the groove and the pits are grown.

In a third manufacturing method of a quantum device according to the present invention, after a tip of an atomic force microscope to which a negative bias is applied is brought into contact with a surface of a semiconductor substrate to form a ring-shaped oxide film and a dot-shaped oxide film adjacent to each other on the surface of the semiconductor substrate in an atmosphere containing water, a ring-shaped groove and a dot-shaped pit are formed in the surface of the semiconductor substrate by removing the ring-shaped oxide film and the dot-shaped oxide film. Then, a quantum ring and a quantum dot are formed by growing semiconductor films in the groove and the dot. It is noted that a single impurity atom is deposited at the center of the ring-shaped oxide film before the step of forming the groove and the pit.

In a fourth manufacturing method of a quantum device according to the present invention, after impurity atoms are introduced into a surface of a semiconductor substrate, a tip of an atomic force microscope to which a negative bias is applied is brought into contact with the surface of the semiconductor substrate to form a ring-shaped oxide film and a dot-shaped oxide film adjacent to each other on the surface of the semiconductor substrate in an atmosphere containing water. Then, portions around the ring-shaped oxide film and the dot-shaped oxide film are oxidized. Subsequently, a ring-shaped groove and a dot-shaped pit are formed in the surface of the semiconductor substrate by removing the ring-shaped oxide film and the dot-shaped oxide film and removing the oxidized portions therearound. Thereafter, a quantum ring and a quantum dot are formed by growing semiconductor films in the groove and the pit.

In a first quantum device according to the present invention, a semiconductor substrate in a surface of which a ring-shaped groove is formed and a semiconductor film formed in the groove are provided.

A second quantum device according to the present invention comprises a qubit (quantum bit). The qubit includes a quantum ring, a single nuclear spin surrounded by the quantum ring, and a quantum dot adjacent to the quantum ring.

A controlling method of a quantum device according to the present invention is targeted for a method of controlling a quantum device comprising a qubit which includes a quantum ring, a single nuclear spin surrounded by the quantum ring, and a quantum dot adjacent to the quantum ring. An electron which exists in the quantum ring is moved into the quantum dot by optical excitation.

DETAILED DESCRIPTION OF THE PREFERRED EMBODIMENTS

Basic Principle of the Present Invention

Figure 1:
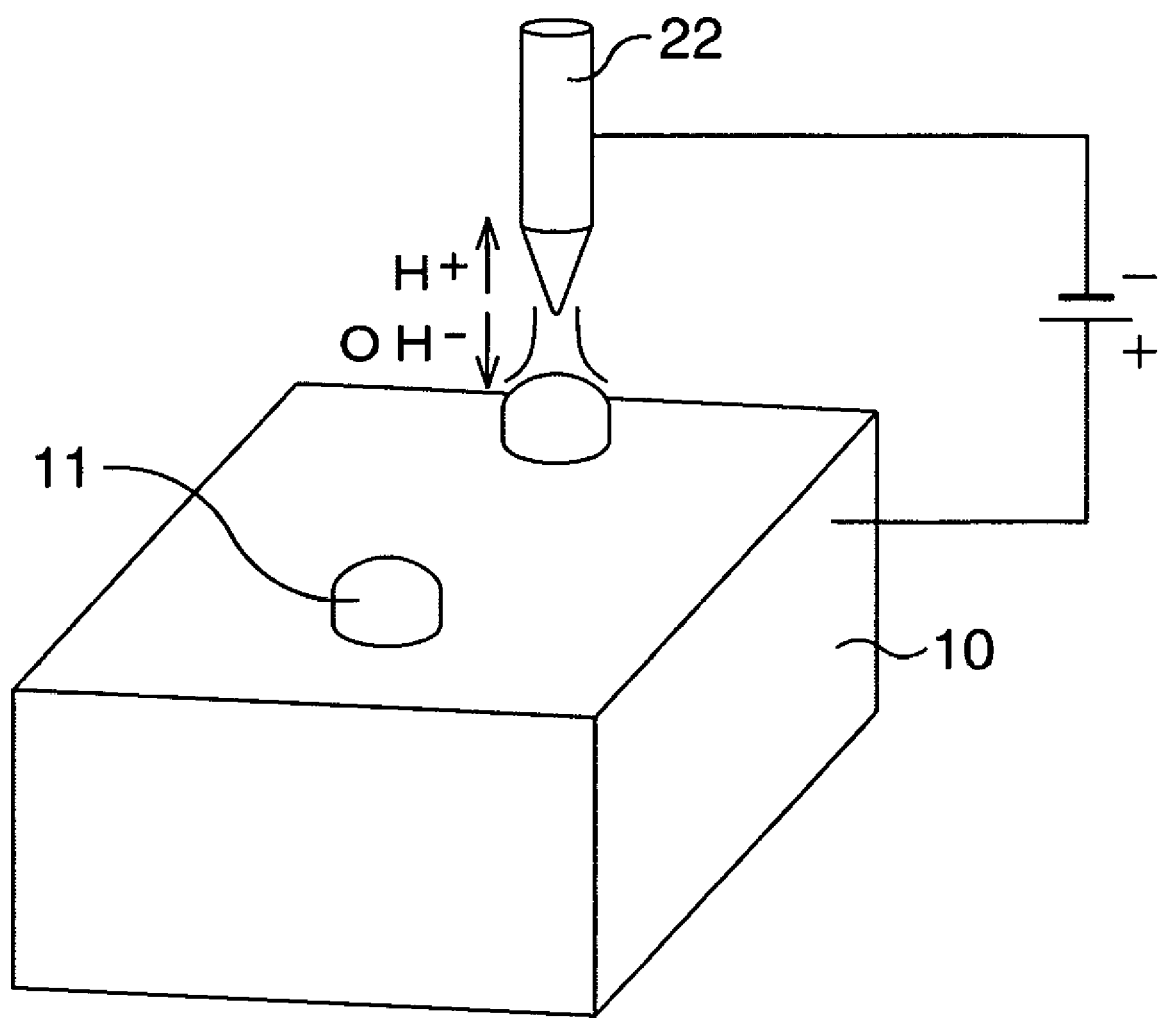
FIG. 1 is a schematic view showing a method of forming an oxide film using an AFM.
Figure 2A:
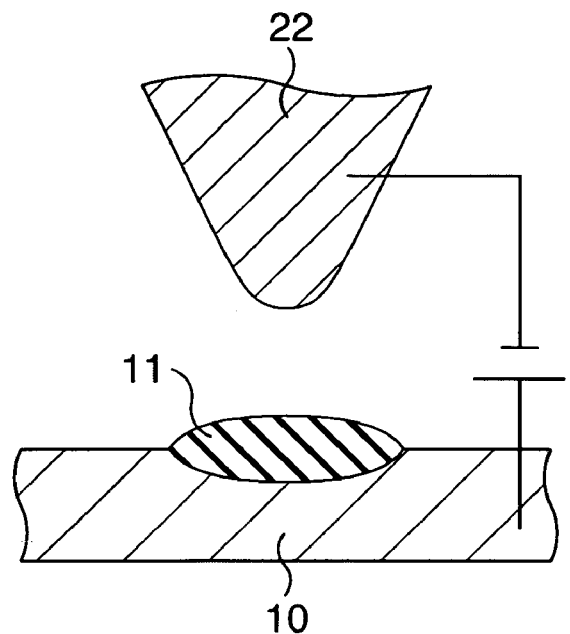
FIG. 2A and FIG. 2B are sectional views showing the method of forming the oxide film step by step.
Figure 2B:
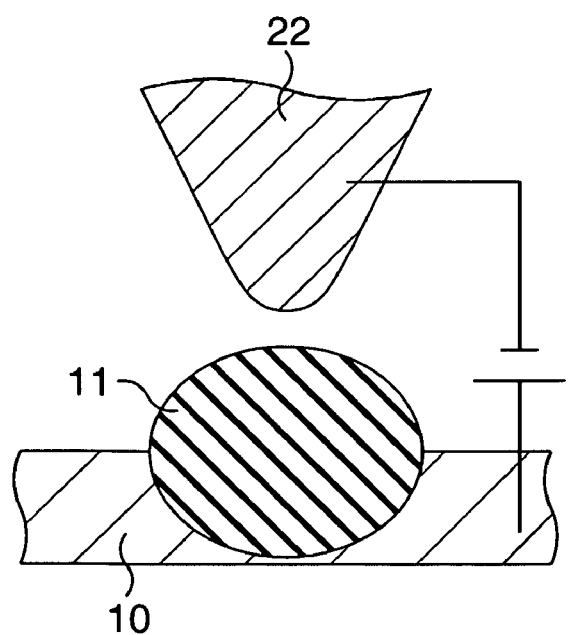

First, the basic principle of the present invention will be described. FIG. 1 is a schematic view showing a method of forming an oxide film using an AFM. FIG. 2A and FIG. 2B are sectional views showing the method of forming the oxide film step by step.

As shown in FIG. 1, when in the atmosphere, a negative bias is applied to a tip 22 of the atomic force microscope (AFM), a positive bias is applied to a semiconductor substrate 10 such as a GaAs substrate, and the tip 22 is moved closer to the semiconductor substrate 10 to such an extent that the distance from the semiconductor substrate 10 becomes approximately 5 nm, the surface of the semiconductor substrate 10 is partially oxidized, and a spherical or ellipsoidal oxide 11 is formed. This is because water ($H_2O$) in the atmosphere is decomposed in proximity to the tip 22, and $OH^-$ acts as an oxidant. Namely, after the minute ellipsoidal oxide film 11 generates as shown in FIG. 2A, the oxide film 11 grows as shown in FIG. 2B.

Figure 3A:
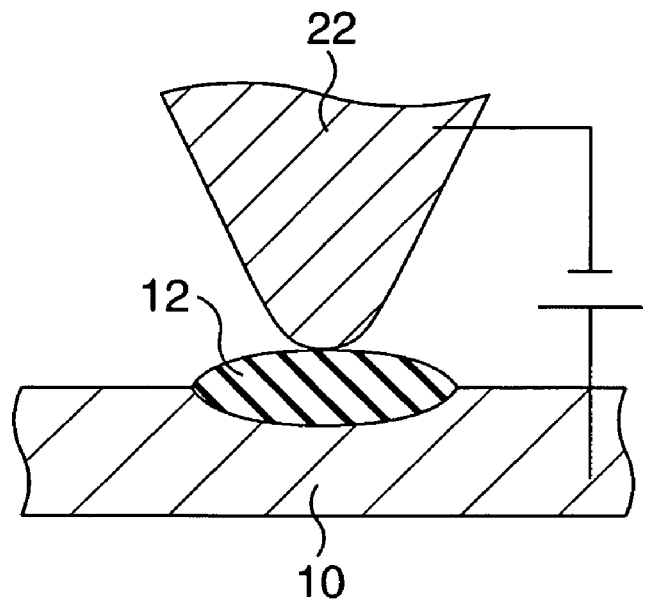
FIG. 3A and FIG. 3B are sectional views showing a method of forming an oxide film by moving a tip 22 closer step by step.

When the tip 22 is moved closer to the semiconductor substrate 10, and, for example, the distance becomes approximately 2 nm, first, an oxide film 12 grows until it touches the tip 22 as shown in FIG. 3A. Thereafter, the oxide film 12 cannot grow vertically in an as-is state, and starts to grow in such a manner as to extend outward, and as shown in FIG. 3B, the oxide film 12 grows in a doughnut shape so as to surround the tip 22.

Figure 4A:
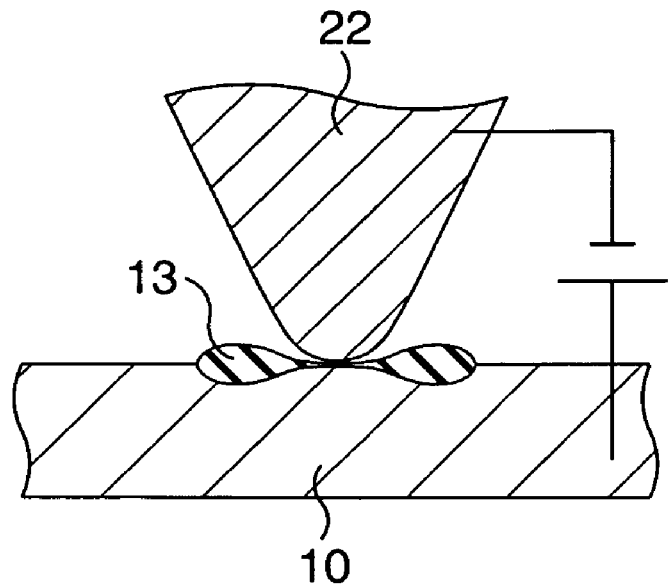
FIG. 4A and FIG. 4B are sectional views showing a method of forming an oxide film by bringing the tip 22 into contact with a semiconductor substrate 10 step by step.
Figure 4B:
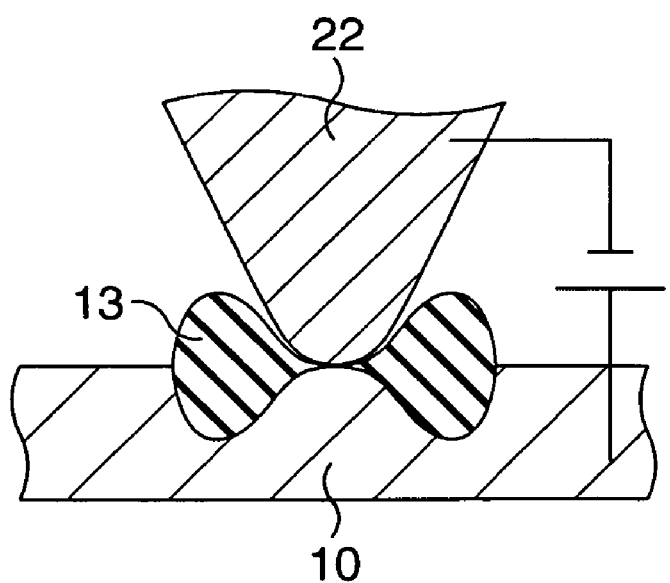

If the tip 22 is brought into contact with the semiconductor substrate 10, a doughnut-shaped oxide film 13 generates from the beginning as shown in FIG. 4A, and the oxide film 13 grows as it is in the doughnut shape as shown in FIG. 4B. Incidentally, a portion of the oxide film 13 which the tip 22 touches does not grow.

Figure 3B:
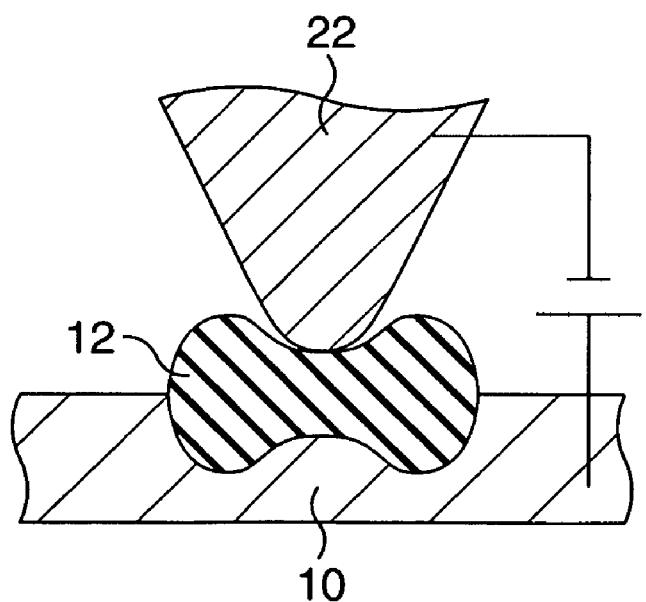

Accordingly, if the semiconductor substrate 10 is oxidized while the tip 22 touches the semiconductor substrate 10 as shown in FIG. 3A and FIG. 3B, the ring-shaped oxide film 13 of almost the same size as a quantum dot can be obtained.

Incidentally, the rate-determining factor of the oxidation reaction of the surface of the semiconductor substrate 10 is not the amount of $H_2O$ but the intensity of an external electric field while the oxide film grows in the ellipsoidal shape, but when the oxide film starts to grow in the doughnut shape, the amount of $H_2O$ becomes the rate-determining factor.

First Embodiment

Next, the first embodiment of the present invention will be described. FIG. 5A to FIG. 5D are sectional views showing a manufacturing method of a quantum ring device according to the first embodiment of the present invention step by step. FIG. 6 is a plan view corresponding to FIG. 5C, and a section taken along the line I-I in FIG. 6 is shown in FIG. 5C.

Figure 5A:
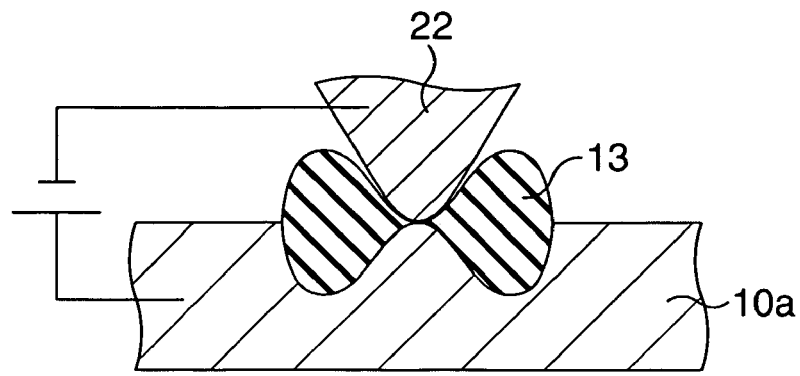
FIG. 5A to FIG. 5D are sectional views showing a manufacturing method of a quantum ring device according to a first embodiment of the present invention step by step.
Figure 6:
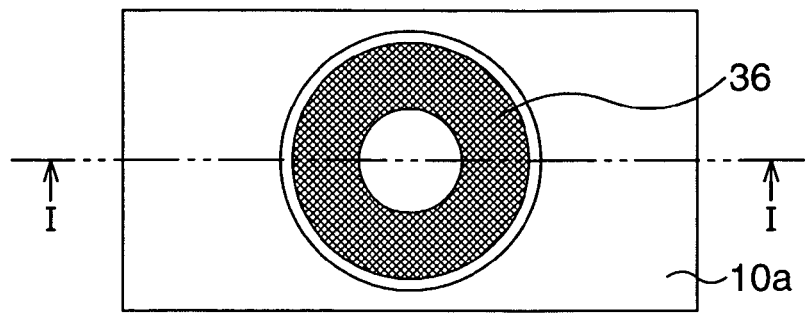
FIG. 6 is a plan view corresponding to FIG. 5C.

In the first embodiment, first, as shown in FIG. 5A, by bringing the tip 22 of the AFM into contact with the surface of an AlGaAs substrate 10a, for example, applying a negative bias to the tip 22, and applying a positive bias to the AlGaAs substrate 10a, the doughnut-shaped oxide film 13 is formed. Incidentally, other substrates such as GaAs substrate may also be used in place of the AlGaAs substrate 10a.

Figure 5B:
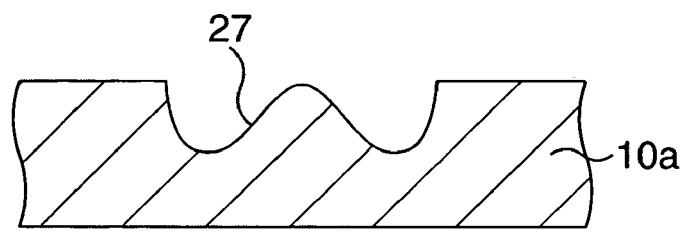
Figure 5C:
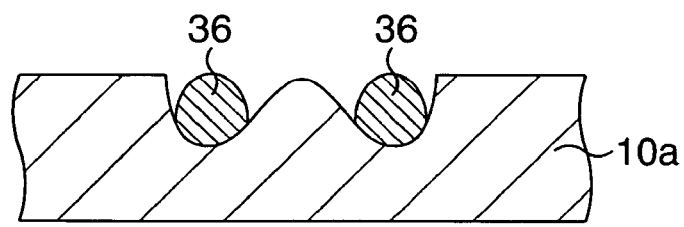

Subsequently, as shown in FIG. 5B, the oxide film 13 is removed. As a result, a ring-shaped groove 27 is formed in the surface of the AlGaAs substrate 10a. The oxide film 13 can be removed, for example, by chemical etching, ultrasonic cleaning with water, a treatment with atomic hydrogen in a vacuum, or the similar.

Thereafter, as shown in FIG. 5C and FIG. 6, a semiconductor film 36 (InAs film or InGaAs film, for example) which is lattice mismatching with the AlGaAs substrate 10a or the GaAs substrate to thereby cause distortion is epitaxially grown in the groove 27. As shown in FIG. 5C and FIG. 6, the width of the ring-shaped semiconductor film 36 is narrower than the width of the ring-shaped groove 27.

In the present invention, all the epitaxial growth, including substrate preparation, quantum structure deposition, and capping layer growth and the like can be performed using molecular beam epitaxy (MBE), metal-organic chemical vapor deposition (MOCVD) or other epitaxial growth.

Figure 5D:
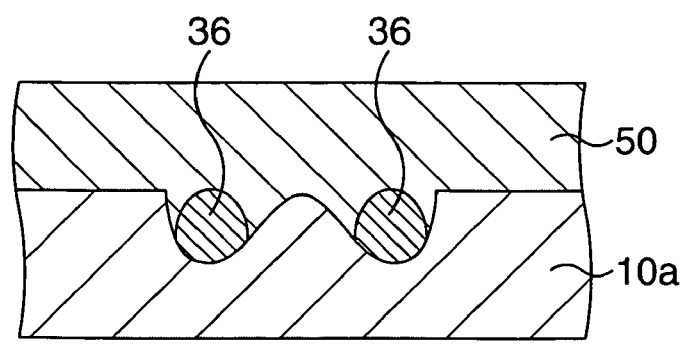

Then, as shown in FIG. 5D, by forming a capping layer 50 which covers the semiconductor film 36 and the AlGaAs substrate 10a, the quantum ring device is finished. As the capping layer 50, for example, a GaAs film, an AlGaAs film, or an AlInGaAs film can be used.

The aforementioned manufacturing method makes it possible to obtain a quantum ring of almost the same size as a quantum dot, whose diameter is approximately 50 nm or less. For example, even if a generally used AFM tip is adopted, the ring diameter can be approximately 20 nm. Moreover, if a specially fine tip made of a carbon nano-tube or something like this is used, a diameter of approximately 10 nm is possible.

Further, in the present embodiment, by controlling the position of the tip 22, the quantum ring can be formed at a desired position of the AlGaAs substrate 10a. Furthermore, the size and shape of the oxide film 13 change according to the humidity in the atmosphere, the potential difference between the tip 22 and the substrate 10a, and the growth time. These three factors can be easily controlled. The thickness of the semiconductor film 36 can be also easily controlled. Hence, according to the present embodiment, the size of the quantum ring can be easily controlled.

Figure 7A:
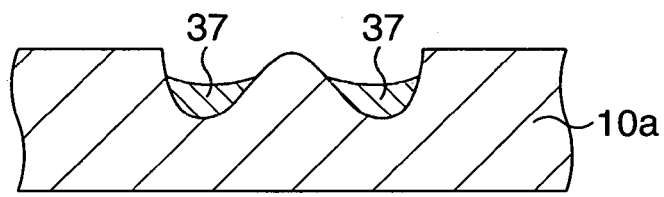
FIG. 7A and FIG. 7B are sectional views showing a manufacturing method of a quantum ring device having a semiconductor film which is lattice matching with the substrate step by step.
Figure 7B:
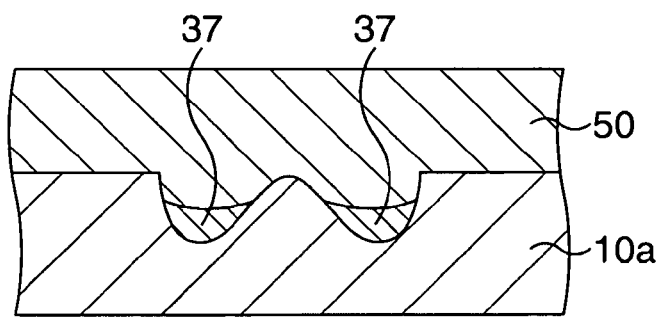
Figure 8:
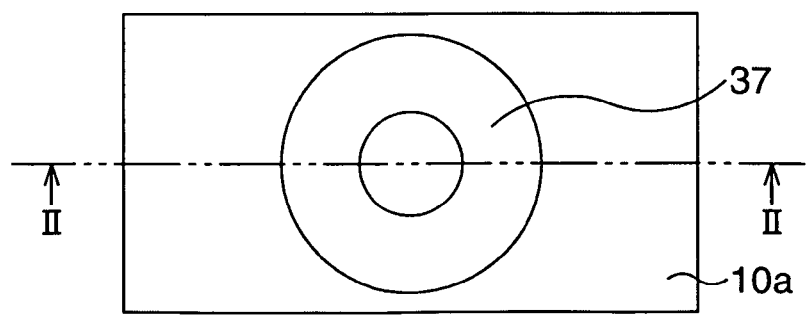
FIG. 8 is a plan view corresponding to FIG. 7A.

Incidentally, in the aforementioned embodiment, the semiconductor film 36 which is lattice-matching with the AlGaAs substrate 10a or the GaAs substrate is formed in the groove 27, but a semiconductor film which is lattice mismatching may also be formed. A lattice-matching example thereof is shown in FIG. 7A, FIG. 7B, and FIG. 8. FIG. 7A and FIG. 7B are sectional views showing a manufacturing method of a quantum ring device step by step. FIG. 8 is a plan view corresponding to FIG. 7A, and a section taken along the line II-II in FIG. 8 is shown in FIG. 7A.

In this example, as shown in FIG. 7A and FIG. 8, a semiconductor film 37 (GaAs film, for example) which is lattice-matching with the AlGaAs substrate 10a or the GaAs substrate is formed. The surface of the semiconductor film 36 is curved in a convex shape as shown in FIG. 5C and FIG. 6, whereas the surface of the semiconductor film 37 is curved in a concave shape as shown in FIG. 7A and FIG. 8.

Then, as shown in FIG. 7B, the quantum ring device is finished by forming the capping layer 50.

Second Embodiment

Figure 9A:
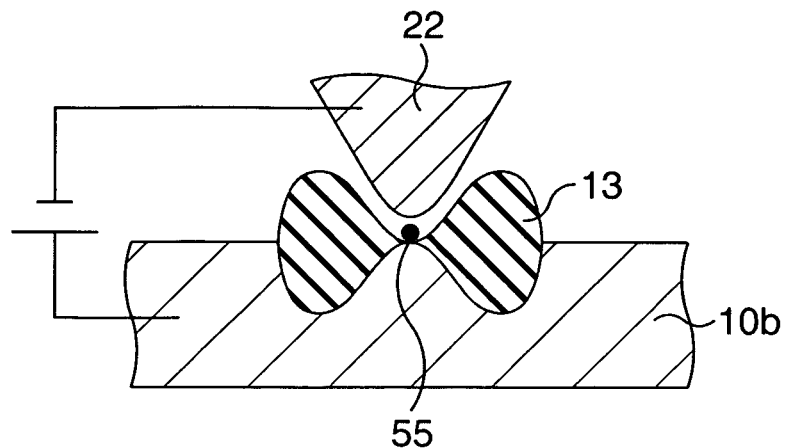
FIG. 9A to FIG. 9C are sectional views showing a manufacturing method of a quantum ring device according to a second embodiment of the present invention step by step.
Figure 9B:
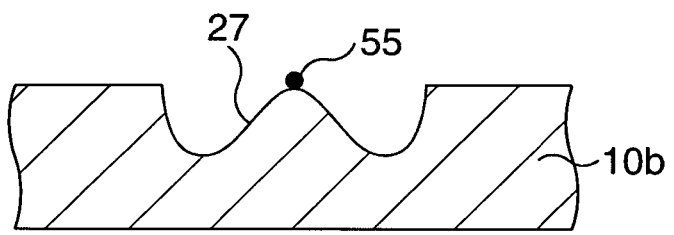
Figure 9C:
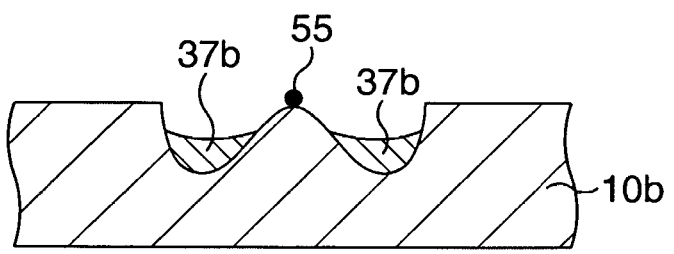
Figure 10:
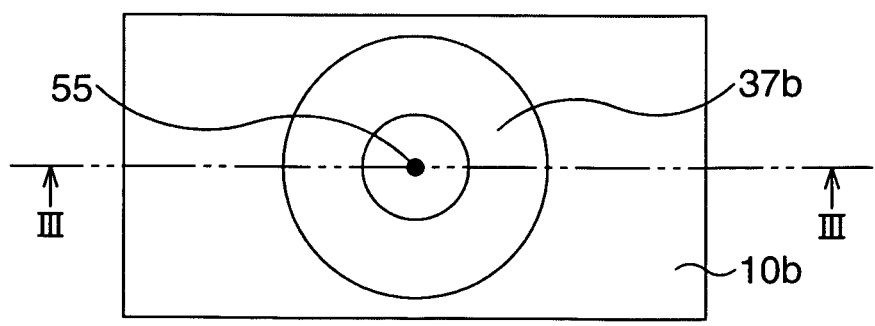
FIG. 10 is a plan view corresponding to FIG. 9C.

Next, the second embodiment of the present invention will be described. In the second embodiment, a doped quantum ring device is manufactured. The physical property of the quantum ring is changed also by impurity doping. At the level of nanotechnology, precise doping into individual quantum rings is required. FIG. 9A to FIG. 9C are sectional views showing a manufacturing method of a quantum ring device according to the second embodiment of the present invention step by step. FIG. 10 is a plan view corresponding to FIG. 9C, and a section taken along the line III-III in FIG. 10 is shown in FIG. 9C.

In the second embodiment, first, as shown in FIG. 9A, the oxide 13 is formed on the surface of a GaAs substrate 10b in the same manner as in the first embodiment. It is noted, however, that in this embodiment, before the oxide film 13 is formed, a metallic atom used as a dopant is attached to a pointed end of the tip 22. Examples of this metallic atom are Si, Be, Fe, Co, and the similer. When a positive bias is applied to the tip 22, the metallic atom is released, but since the bias applied to the tip 22 when the oxide film 13 is formed is negative, the metallic atom is not detached. Moreover, the tip 22 itself may contain the metallic atom used as the dopant.

Then, also as shown in FIG. 9A, by applying a positive bias to the tip 22 after the tip 22 is moved away from the surface of the GaAs substrate 10b, a positive dopant 55 is deposited on a center of the ring-shaped oxide film 13, that is, a portion where the oxide film 13 is not formed. On this occasion, by adjusting the applied voltage and application time, the dopant 55 to be deposited can be only one atom.

Incidentally, the oxide film 13 may be formed after the dopant 55 is deposited. In consideration of stability of deposition of the dopant 55, it is desirable that before the oxide film 13 is formed, the dopant 55 is deposited and additionally annealing is performed.

Subsequently, as shown in FIG. 9B, the groove 27 is formed by removing the oxide film 13 in the same manner as in the first embodiment. Note that this needs to be performed on condition that the dopant 55 is not detached. Moreover, in order to prevent the dopant 55 from being detached, some thermal treatment may be performed to diffuse the dopant 55 into the GaAs substrate 10b before the oxide 13 is removed.

Thereafter, as shown in FIG. 9C and FIG. 10, a semiconductor film 37b (GaAs film, for example) which is lattice-matching with the GaAs substrate 10b is formed. At this time, a semiconductor film which is lattice-mismatching to thereby cause distortion may be also formed.

Then, the quantum ring device is finished by forming a capping layer (not shown in FIG. 9C) in the same manner as in the first embodiment.

According to the second embodiment, a paramagnetic or ferromagnetic quantum ring can be obtained. The use of such a quantum ring makes it possible to obtain a nano-scale device which shows an Arharanov-Bohm effect.

Incidentally, when a Si substrate is used as a semiconductor substrate, it is desirable to use P or B as a dopant.

Third Embodiment

Next, the third embodiment of the present invention will be described. In the third embodiment, a doped quantum ring device is manufactured by a method different from that in the second embodiment. FIG. 11A to FIG. 11D are sectional views showing a manufacturing method of a quantum ring device according to the third embodiment of the present invention step by step. FIG. 12 is a plan view corresponding to FIG. 11D, and a section taken along the line IV-IV in FIG. 12 is shown in FIG. 11D.

Figure 11A:
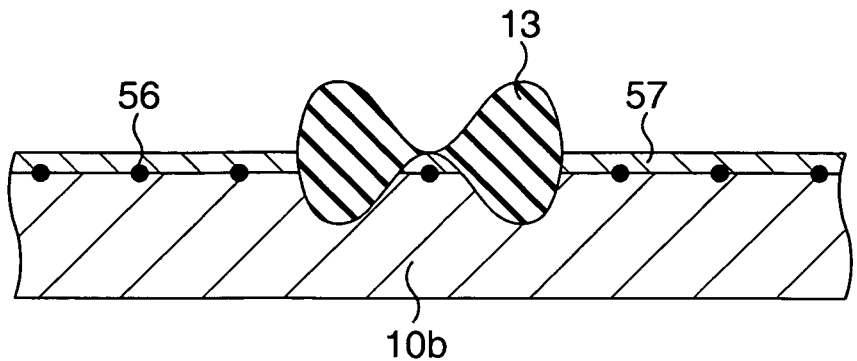
FIG. 11A to FIG. 11D are sectional views showing a manufacturing method of a quantum ring device according to a third embodiment of the present invention step by step.
Figure 12:
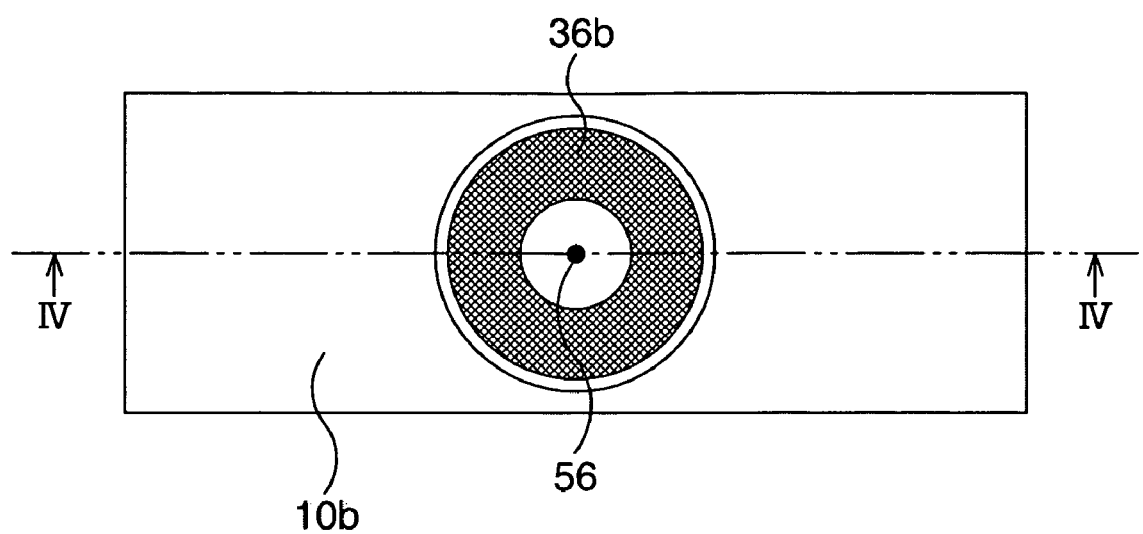
FIG. 12 is a plan view corresponding to FIG. 11D.

In the third embodiment, first, as shown in FIG. 11A, dopants 56 in small quantities are incorporated (by δ-doping, for example) at a depth of 1 nm to 2 nm from the surface of the GaAs substrate 10b. At this time, doping conditions are adjusted so that only the single atom dopant 56 exists at a position where a quantum ring is to be formed. Then, an epitaxial layer 57 such as a GaAs layer is formed. Thereafter, also as shown in FIG. 11A, the oxide film 13 is formed in the same manner as in the first embodiment.

Figure 11B:
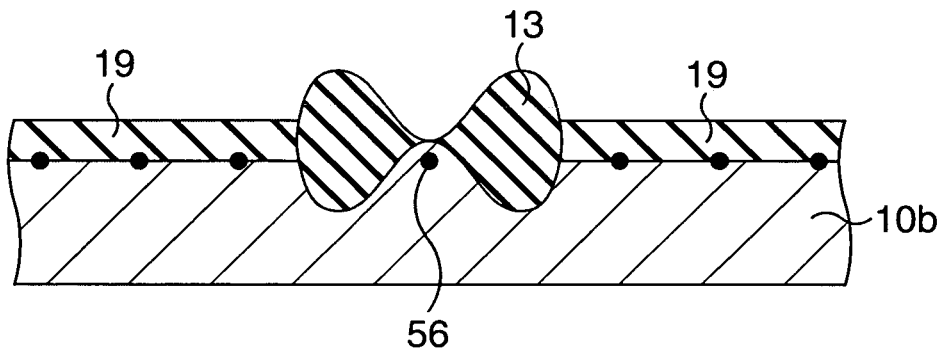

Subsequently, the tip 22 is moved away from the GaAs substrate 10b, and while scanning the tip 22, an oxide film 19 is formed around the oxide film 13 as shown in FIG. 11B. Namely, the oxide film 19 is formed on the entire surface except the center of the oxide film 13. Similarly to the oxide film 13, the oxide film 19 is formed by an oxidation reaction accompanying the decomposition of $H_2O$ in the atmosphere. The thickness of the oxide film 19 is thicker than that of the epitaxial layer 57. Note that the distance from a bottom portion of the oxide film 13 to a lower surface of the oxide film 19 is sufficiently secured. Incidentally, in FIG. 11B, to simplify the figure, the remaining epitaxial layer 57 is shown as being united with the GaAs substrate 10b.

Figure 11C:
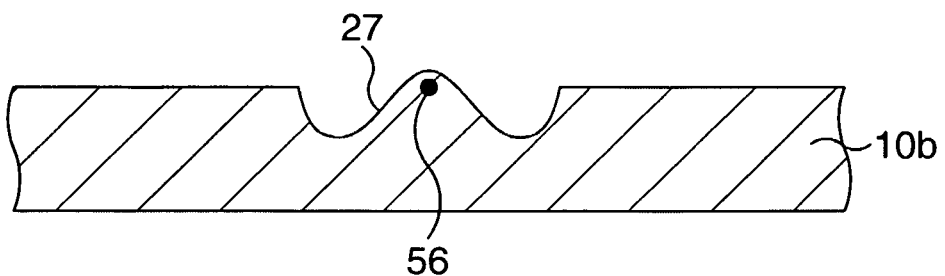
Figure 11D:
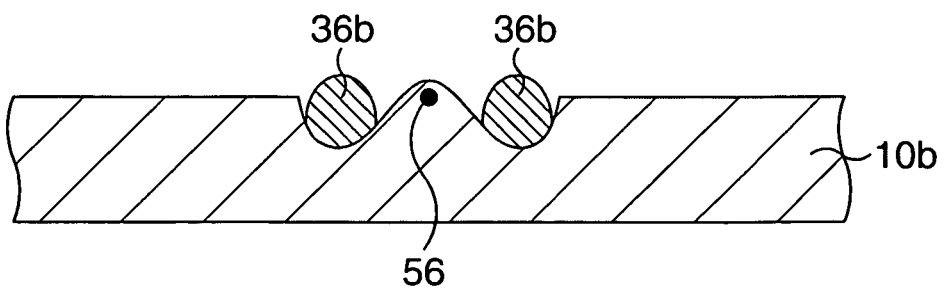

Thereafter, as shown in FIG. 11C, by removing the oxide films 13 and 19 in the same manner as in the first embodiment, a groove 27 is formed. As a result, the dopants 56 are removed except that existing in a center portion of the groove 27.

Subsequently, as shown in FIG. 11D and FIG. 12, a semiconductor film 36b (InGaAs film, for example) which is lattice mismatching with the GaAs substrate 10b to thereby cause distortion is formed. At this time, a semiconductor film which is lattice-matching may also be formed.

Then, the quantum ring device is finished by forming a capping layer (not shown in FIG. 11D) in the same manner as in the first embodiment.

Also according to the third embodiment, the same effect as in the second embodiment can be obtained. For example, in the GaAs-based quantum ring, one electron or hole can be exactly introduced if the dopant 56 such as Si, Be, and the similar is used.

Incidentally, dopant ion and electron wave function are spatially separated. For a quantum device, this is rather advantageous. This is because an impurity scattering effect to the carrier is reduced as in a high mobility transistor. As a result, the coherence of a quantum state in the quantum ring is improved, and thereby the quantum ring suitable for a quantum computer and quantum information can be obtained.

Operation of Quantum Ring Device

Next, the operation of the quantum ring device manufactured as described above will be described. Generally, state of a carrier in the quantum ring can be changed by locally applying a magnetic field and/or an electric field. By detecting light emission, for example, the state of the quantum ring can be known. Therefore, the quantum ring device can be used as a storage device such as a memory, a detector, a light emitter, or the like. Here, the first embodiment will be explained as an example, but also regarding the second and the third embodiment, the same operation is possible. FIG. 13A to FIG. 13D are schematic views showing the operation of the quantum ring devices manufactured according to the embodiments of the present invention.

Figure 13A:
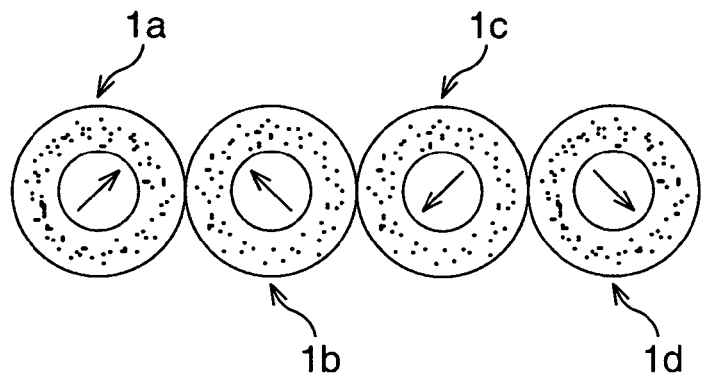
FIG. 13A to FIG. 13D are schematic views showing the operation of the quantum ring devices manufactured according to the embodiments of the present invention.

Here, as shown in FIG. 13A, it is assumed that four enclosed quantum rings according to the first embodiment are formed side by side in one direction, and four qubits 1a to 1d are composed of the four quantum rings. When no electric field is applied, the respective qubits 1a to 1d interact with one another. Namely, the spin state of each of the qubits 1a to 1d is influenced by the spin states of the other qubits. Moreover, the wave function of each of the qubits 1a to 1d maintains symmetry in the quantum ring.

Thereafter, when an electric field F is uniformly applied from a direction orthogonal to the direction in which the qubits 1a to 1d are arranged, the wave function which is symmetrical in the quantum ring becomes anisotropic, namely, the probability distribution of the wave function changes. This change reduces the coupling between adjacent two qubits and makes it possible to independently control the qubits. For example, it is possible to initialize the qubits individually by ESR, spin injection, or something else.

Figure 13B:
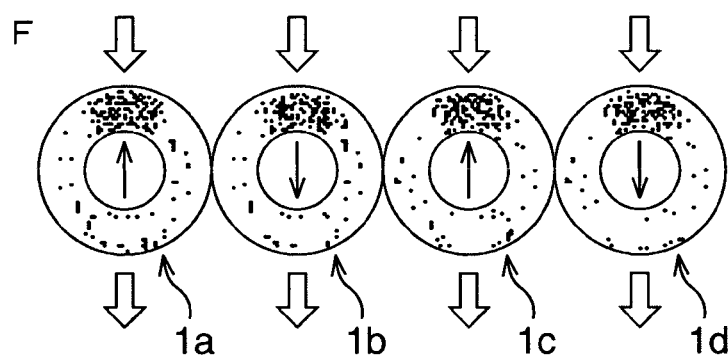

Now, with the electron spin as |0> for an upward direction and |1> for a downward direction based on the bracket notation, a general quantum state is expressed as "$\alpha|0> + \beta|1>$ ($|\alpha|^2 + |\beta|^2 = 1$)". The state shown in FIG. 13B is expressed as |0101>.

Figure 13C:
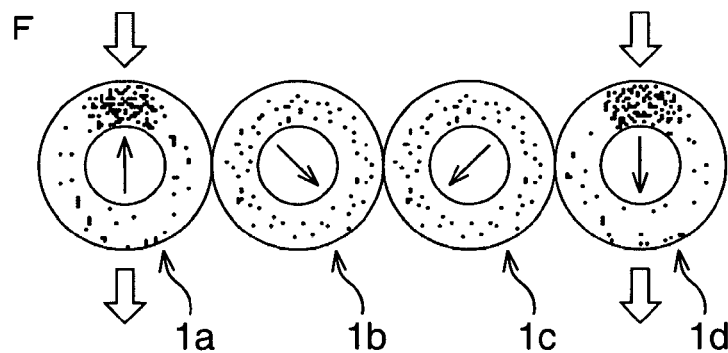

Subsequently, when the application of the electric field F to the qubits 1b and 1c is stopped, as shown in FIG. 13C, the wave functions of the qubits 1b and 1c change so that the symmetry reappears. Moreover, the interaction between the qubits 1b and 1c and swapping in some cases occur. As a result of this unitary operation, the states of the qubits 1b and 1c can be changed while the states of the qubits 1a and 1d are maintained.

Figure 13D:
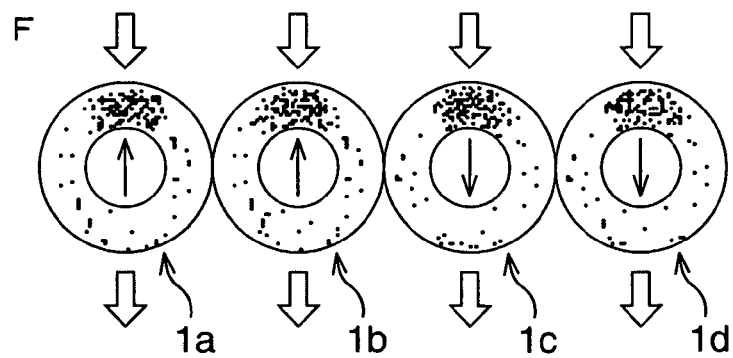

Then, when the electric field F is applied again to the qubit 1*b* and/or 1*c* immediately after the state shown in FIG. 13C is obtained, that is, after an exchange of spins between the qubits 1*b* and 1*c* is performed, the unitary operation is stopped. As shown in FIG. 13D, the wave function in the quantum ring again becomes anisotropic to keep independent of each other. As compared with the state shown in FIG. 13B, the directions of electron spins of the qubits 1*b* and 1*c* are opposite. As a result, the quantum state shown in FIG. 13D is expressed as |10011>. Based on this, a control NOT (CNOT) gate operation can be realized.

Next, the operation of an all-optical operation quantum device constructed by combining quantum dots and quantum rings will be described. For example, in Non-Patent Document 6, it is described that a quantum computer is constructed by combining a main quantum dot and plural auxiliary quantum dots smaller than the main quantum dot, and it is also possible to replace the main dot with an impurity-doped quantum ring.

Figure 14A:
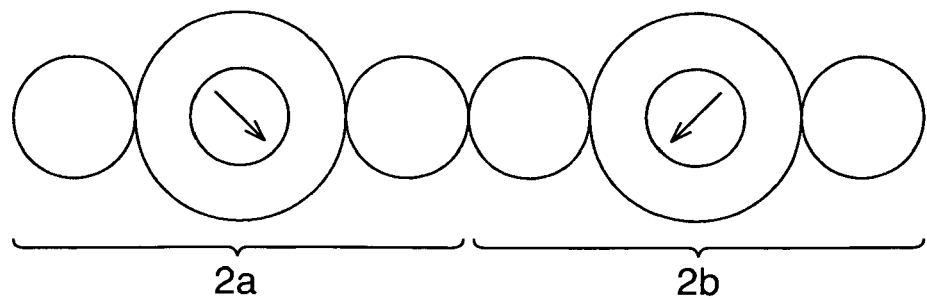
FIG. 14A to FIG. 14D are schematic views showing the operation of an all-optical operation quantum device constructed by combining quantum dots and quantum rings.

In this case, a quantum device having a structure such as shown in FIG. 14A is obtained. Namely, one qubit is composed of one quantum ring 3 and quantum dots 4 placed therearound. By arranging two sets of these quantum ring 3 and quantum dots 4, two qubits 2*a* and 2*b* are configured. Incidentally, one qubit needs to contain only one carrier. Note that the quantum ring 3 is not necessarily required to touch the quantum dots 4.

Figure 14B:
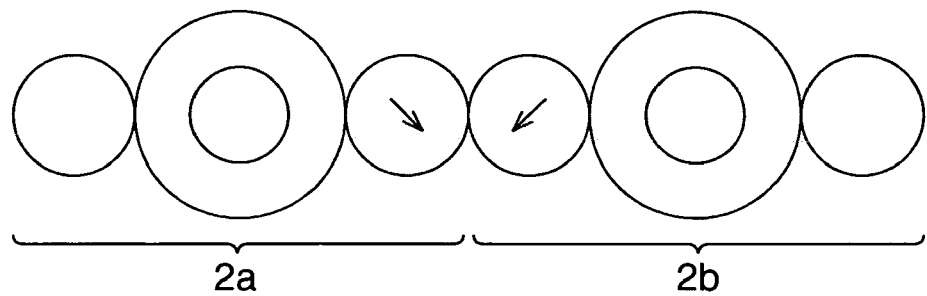

As shown in FIG. 14A, in a stand-by state, the electron in a definite spin state exists in the quantum ring 3. When the electrons are excited by the action of a coherent pulse in this stand-by state, the electrons in the respective qubits 2*a* and 2*b* move to the adjacent quantum dots 4 as shown in FIG. 14B.

Figure 14C:
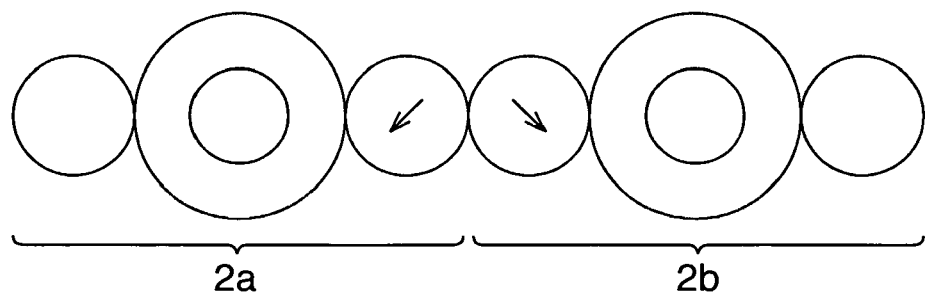

Thereafter, swapping occurs, and an exchange of spins in the quantum dots 4 is performed as shown in FIG. 14C.

Figure 14D:
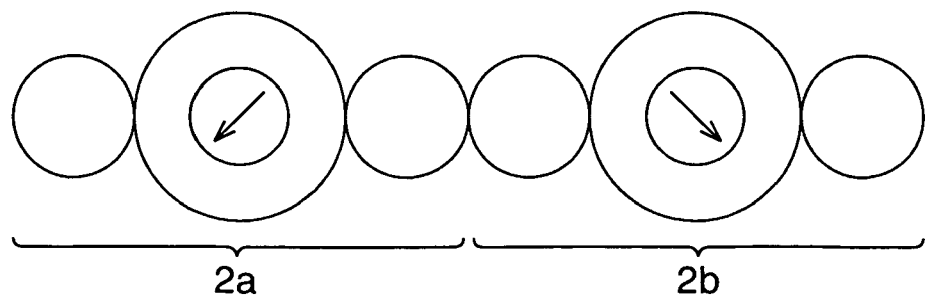

Then, when the electrons are excited again by the action of a coherent pulse, the electrons in the qubits 2*a* and 2*b* move from the quantum dots 4 to the quantum rings 3 as shown in FIG. 14D.

As described above, in this example, it is required to inject one carrier into one qubit. The use of the quantum ring is suitable for this requirement since it makes the selective injection of the carrier easily possible. Namely, by applying the third embodiment, the structure in FIG. 14A can be easily obtained. This method is shown in FIG. 15A to FIG. 15D and FIG. 16. FIG. 15A to FIG. 15D are sectional views showing a manufacturing method of a quantum device including a quantum ring and quantum dots step by step, FIG. 16 is a plan view corresponding to FIG. 15D, and a section taken along the line V-V in FIG. 16 is shown in FIG. 15D.

Figure 15A:
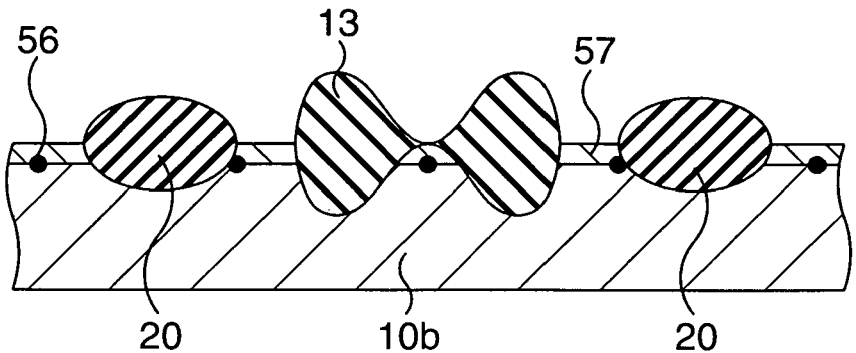
FIG. 15A to FIG. 15D are sectional views showing a manufacturing method of a quantum device including a quantum ring and quantum dots step by step.
Figure 15B:
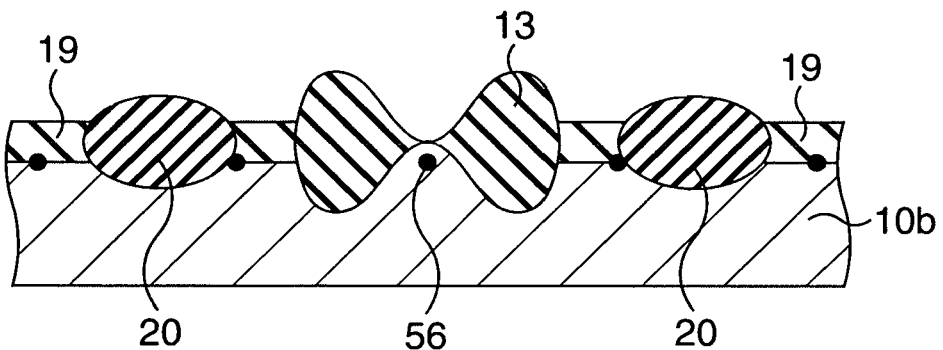
Figure 15C:
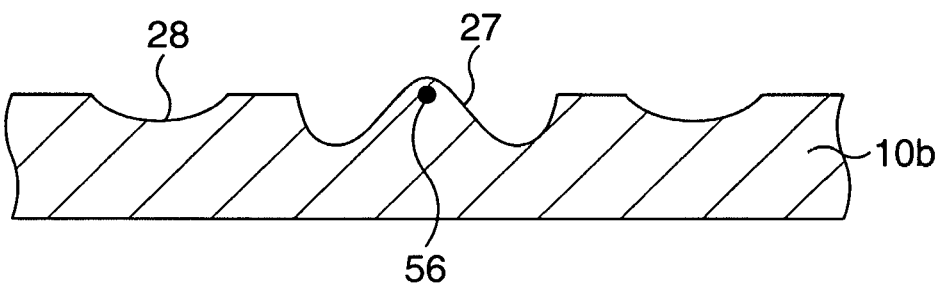
Figure 15D:
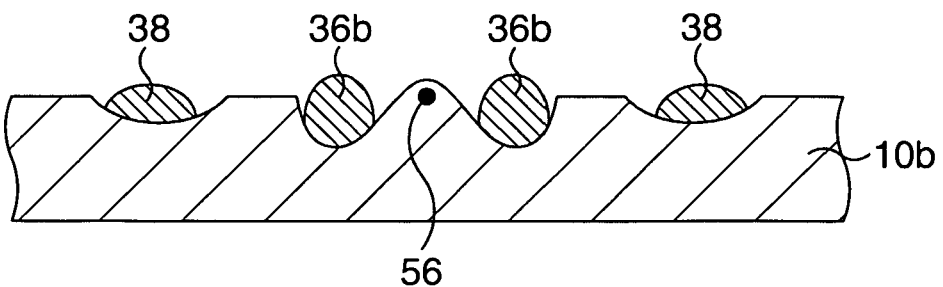
Figure 16:
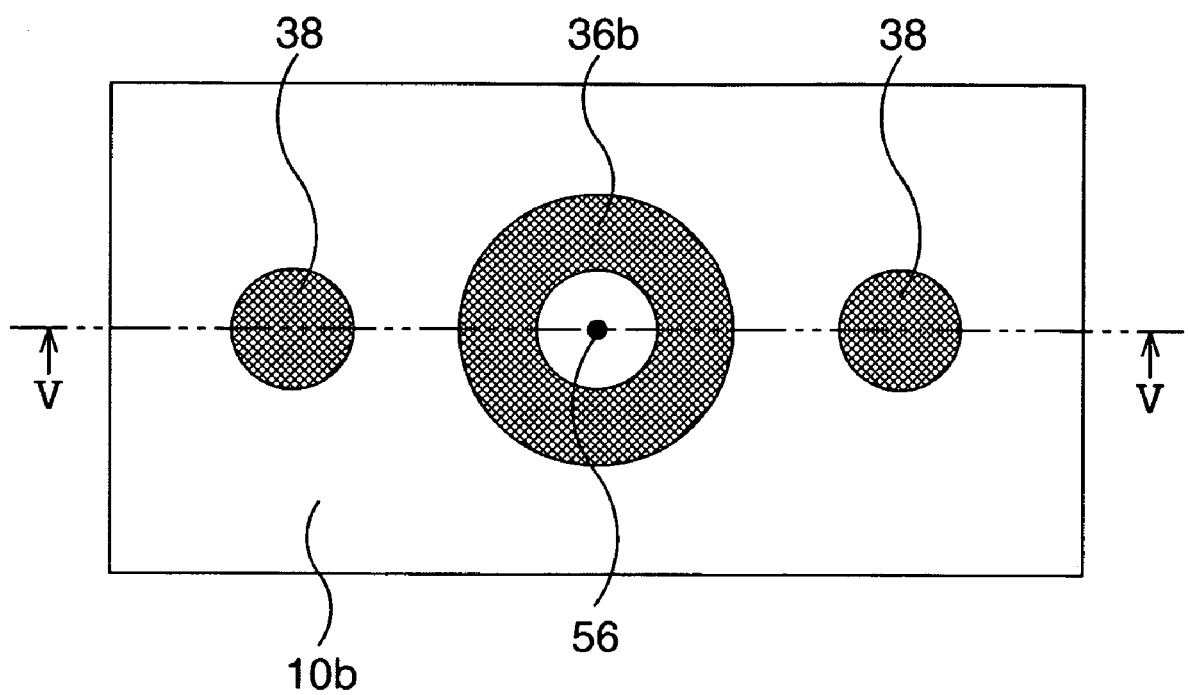
FIG. 16 is a plan view corresponding to FIG. 15D.

First, as shown in FIG. 15A, after the injection of the dopants 56 and formation of the epitaxial layer 57, the oxide film 13 is formed, and ellipsoidal oxide films 20 are formed by the method shown in FIG. 2A and FIG. 2B. Then, as shown in FIG. 15B, by scanning the tip 22 at a distance from the substrate 10*b*, the oxide film 19 is formed. Subsequently, as shown in FIG. 15C, the oxide films 13, 19, and 20 are removed to thereby form the ring-shaped groove 27 and dot-shaped pits 28.

Thereafter, as shown in FIG. 15D and FIG. 16, the semiconductor film 36*b* which is lattice-mismatching with the substrate 10*b* to thereby cause distortion is epitaxially grown in the groove 27, and simultaneously similar semiconductor films 38 are epitaxially grown in the pits 28.

Then, the quantum ring device is finished by forming a capping layer (not shown in FIG. 15D) in the same manner as in the first embodiment.

According to this method, the dopant 56 can be implanted to a desired extent at a desired position, so that one carrier can be contained in one qubit. Namely, it becomes possible that the carrier is injected only into the quantum ring, and no carrier exists in the quantum dot.

Fourth Embodiment

Figure 17:
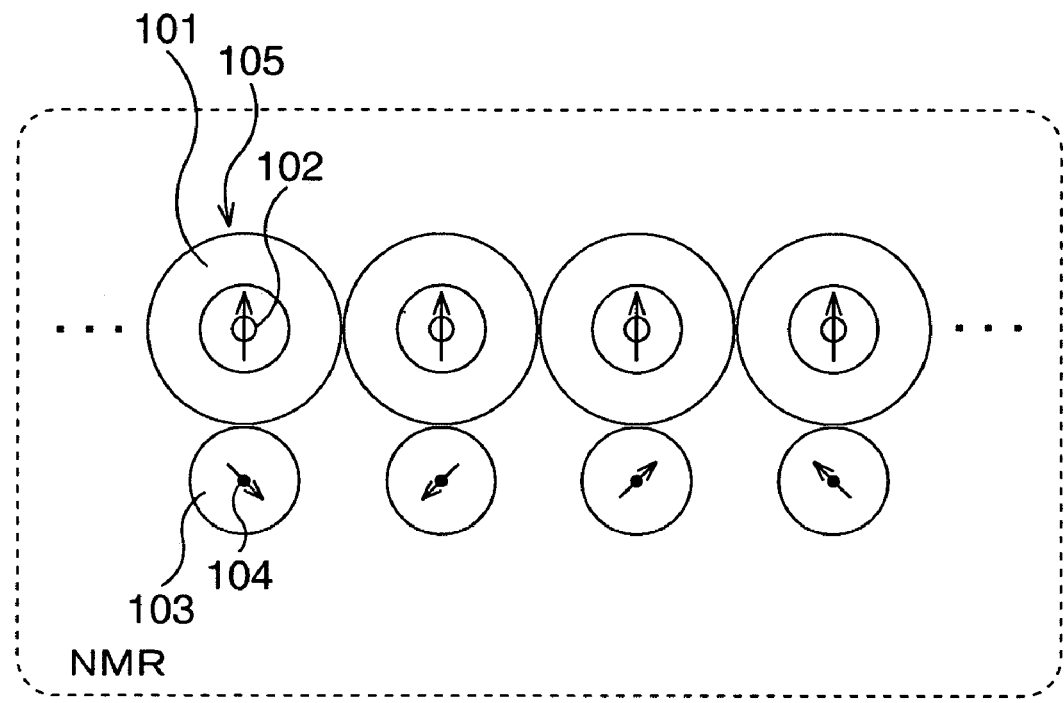
FIG. 17 is a schematic view showing a quantum device according to a fourth embodiment of the present invention.
Figure 18:
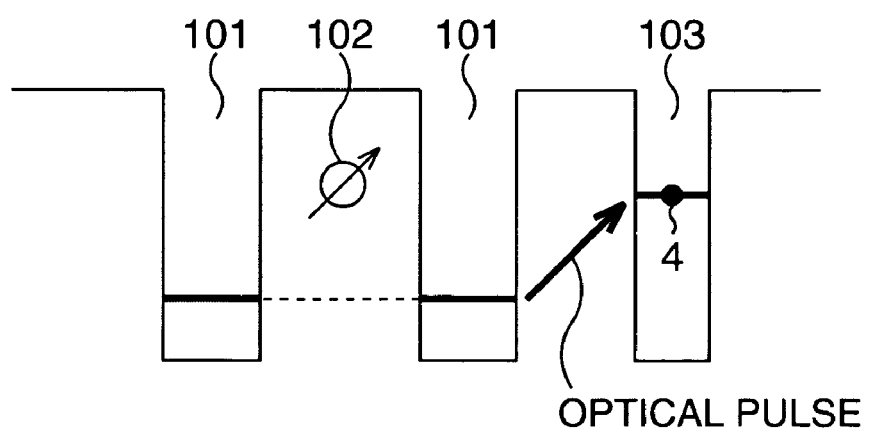
FIG. 18 is a diagram showing excitation of an electron.

Next, the fourth embodiment of the present invention will be described. FIG. 17 is a schematic view showing a quantum device according to the fourth embodiment of the present invention.

In the quantum device according to this embodiment, plural quantum rings 101 are arranged in one direction on a semiconductor substrate. One $^{31}$P atom 102 exists in the center portion of each of the quantum rings 101. One quantum dot 103 is formed adjacent to each of the quantum rings 101. The semiconductor substrate is one which is formed, for example, by growing a $Si_{1-x}Ge_x$ epitaxial layer with a thickness of approximately 100 nm on an Si substrate. The quantum ring 101 is composed of a ring-shaped Si or $Si_{1-x}Ge_x$ (note that x is smaller than that of the epitaxial layer) film. The quantum dot 103 is composed of a dot-shaped Si or $Si_{1-x}Ge_x$ (note that x is smaller than that of the epitaxial layer) film. The $^{31}$P atom 102 is introduced, for example, in the process of forming the quantum ring 101. The diameter of the quantum ring 101 is approximately 50 nm or less and more preferably approximately 10 nm. The diameter of the quantum dot 103 is approximately 40 nm or less and more preferably approximately 10 nm. Incidentally, as Si and Ge composing these quantum ring and dot, it is desirable to use those without a nuclear spin.

In this embodiment, a qubit 105 is composed of the quantum ring 101, the $^{31}$P atom 102, and the quantum dot 103, and the qubit 105 inevitably includes an electron 104 with the existence of the $^{31}$P atom 102. Incidentally, the electron 104 is confined in the quantum ring 101 or the quantum dot 103.

In the quantum device thus constructed, an effective hyperfine interaction between an electron spin and a nuclear spin functions. Consequently, the states of spins can be controlled by applying an optical pulse instead of applying an electric field from an external electrostatic gate or the like to manipulate the electron as in the prior art. The electron 104 is not influenced by the voltage applied from the outside. As a result, the stability of the operation is increased.

Here, an example of the operation of the quantum device will be described. The electron 104 exists in the quantum ring 101 in the state after manufacturing. When a predetermined optical pulse is applied to each of the qubits 105 in this state, the electron 104 is excited to move from the quantum ring 101 to the quantum dot 103. As a result, the nuclear spin of the $^{31}$P atom 102 becomes free from interaction with the spin of the electron 104. This state is maintained for a period of time when the coherent state is maintained, so it is defined as the standby state in this embodiment.

As shown in FIG. 17, by giving an rf pulse with a frequency ν and applying a magnetic field to all the qubits 105, all the nuclear spins can be initialized. This is because resonant radio frequencies of all the qubits 105 are equal to one another. The frequency ν is expressed here as "$\nu=2g_n\mu_n B/h$", where B is an intensity of the applied magnetic field, $\mu_n$ is the nuclear magneton, $g_n$ is the nuclear g factor, and h is a Plank's constant.

Figure 19:
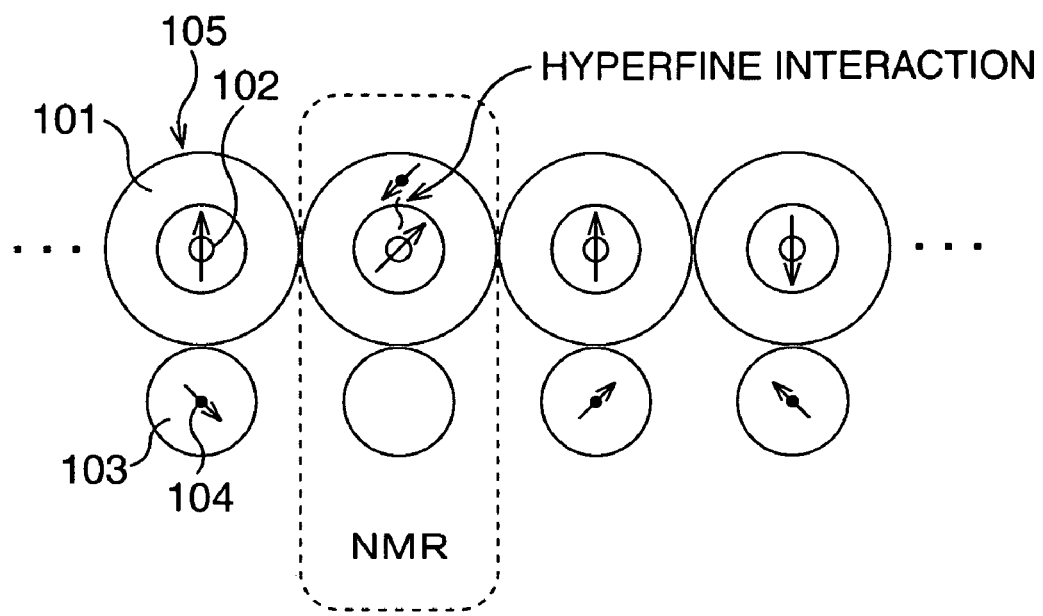
FIG. 19 is a diagram showing hyperfine interaction.

Moreover, for example, by applying an optical pulse to one qubit 105, the electron 104 existing in the quantum dot 103 in this qubit 105 can be returned into the quantum ring 101. On this occasion, the optical pulse is sometimes applied to other qubits 105 adjacent to the qubit 105 to be manipulated, but by appropriately adjusting its wavelength, the wrong operation in the other qubits 105 can be avoided. Then, when the electron 104 is returned into the quantum ring 101 as shown in FIG. 19, the hyperfine interaction functions between the spin of the electron 104 and the nuclear spin of the $^{31}$P atom 102. As a result, the NMR frequency in this qubit 105 changes. A resonant frequency $v_A$ after the change is derived from "$hv_A=2g_n\mu_n B+2A+2A^2/\mu_B B$", where A is hyperfine interaction energy and $\mu_B$ is a Bohr magneton. Incidentally, the hyperfine interaction energy A depends on the wave function of the electron overlapping with the nuclear.

The aforementioned manipulation of the single qubit 105 makes it possible to selectively rotate one nuclear spin. Namely, by applying an NMR pulse with the resonant frequency $v_A$, a single nuclear spin can be rotated without influence to the nuclear spins in the remaining qubits 105. This rotation of the nuclear spin is finished by the movement of the electron 104 and the termination of the NMR pulse.

Figure 20:
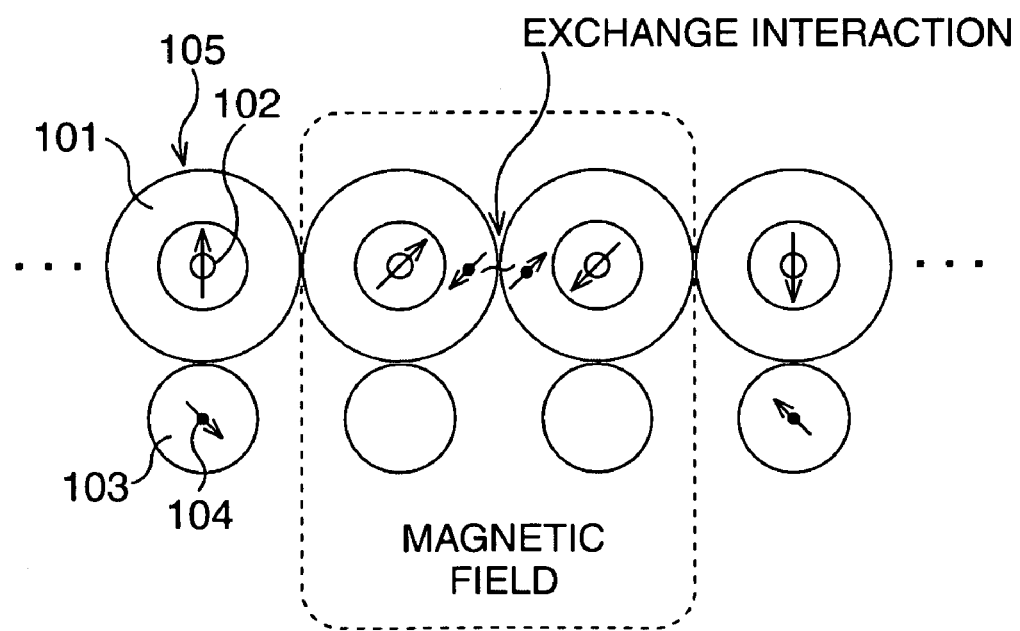
FIG. 20 is a diagram showing exchange interaction.

Furthermore, for example, by applying an optical pulse to the two adjacent qubits 105, the electrons 104 existing in the quantum dots 103 in these two qubits 105 can be returned into the quantum rings 101. This manipulation makes it possible to use an exchange coupling between the two qubits 105. As described above, in each of these two qubits 105, the hyper interaction functions between the spin of the electron 104 and the nuclear spin. Since the quantum rings 101 are close to each other in these two qubits 105, the spins of the two electrons 104 are coupled by exchange interaction, as shown in FIG. 20. Hence, if a suitable magnetic field is applied, nuclear spins in the adjacent two qubits 105 can be also coupled by the exchange interaction of the electron spins and the hyperfine interaction between the electron spin and the nuclear spin. Namely, the nuclear spins of the two $^{31}$P atoms can be rotated.

By applying an optical pulse again to return the electrons 104 into the quantum dots 103 after the aforementioned manipulation, the coupling can be turned off to return to the stand-by state.

According to the fourth embodiment, the appropriate manipulation of the nuclear spin can be performed easily in the quantum device in solid state.

Figure 23:
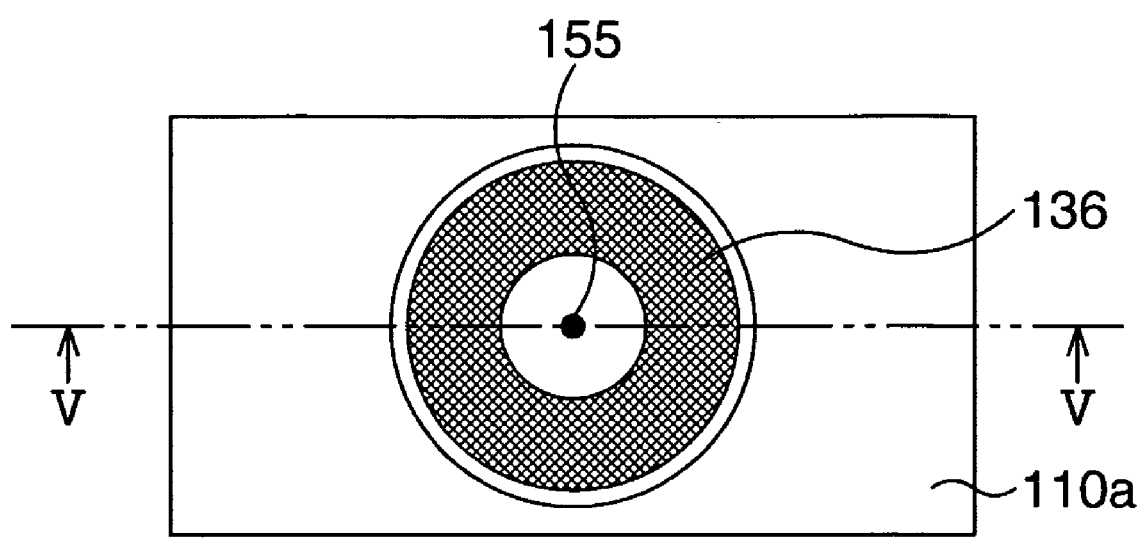
FIG. 23 is a plan view corresponding to FIG. 21C.

Next, a manufacturing method of the aforementioned quantum device will be described. The quantum dot and the quantum ring can be formed based on the aforementioned oxide film formation. FIG. 21A to FIG. 21D are sectional views showing the manufacturing method of the quantum device according to the fourth embodiment of the present invention step by step. It is noted that only a quantum ring portion is shown in FIG. 21A to FIG. 21D. FIG. 23 is a plan view corresponding to FIG. 21C, and a section taken along the line V-V in FIG. 23 is shown in FIG. 21C.

Figure 21A:
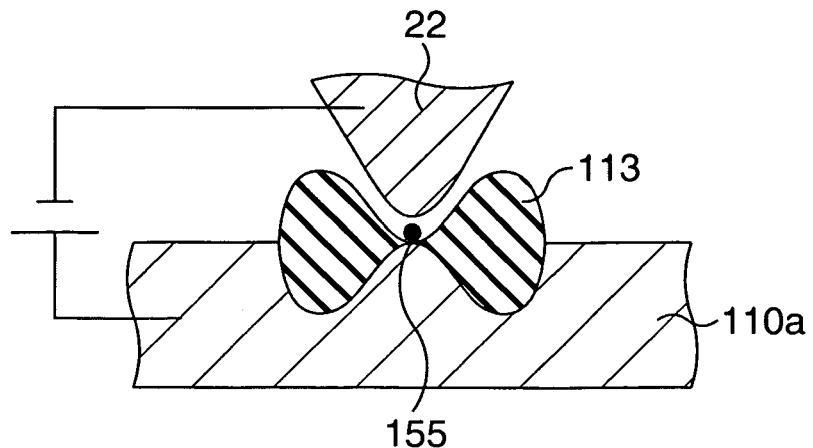
FIG. 21A to FIG. 21D are sectional views showing a manufacturing method of the quantum device according to the fourth embodiment of the present invention step by step.

In this method, first, as shown in FIG. 21A, by bringing the tip 22 of the AFM into contact with the surface of a semiconductor substrate 110a, applying a negative bias to the tip 22, and applying a positive bias to the semiconductor substrate 110a, a doughnut-shaped oxide film 113 is formed in a region where a quantum ring 103 is to be formed. Note that in this embodiment, before the oxide film 113 is formed, a metallic atom used as a dopant is attached to the pointed end of the tip 22. An example of this metallic atom is a $^{31}$P atom. When a positive bias is applied to the tip 22, the metallic atom is released, but since the bias applied to the tip 22 when the oxide film 113 is formed is negative, the metallic atom is not detached. Moreover, the tip 22 itself may contain the metallic atom used as the dopant.

Before or after the oxide film 113 is formed, a dot-shaped oxide film (not shown) is formed in a region where a quantum dot 103 is to be formed.

Then, also as shown in FIG. 21A, by applying a positive bias to the tip 22 after the tip 22 is moved away from the surface of the semiconductor substrate 110a, a positive dopant 155 is deposited on a center of the ring-shaped oxide film 113, that is, a portion where the oxide film 113 is not formed. At this time, by adjusting the applied voltage and application time, the dopant 155 to be deposited can be only one atom.

Incidentally, the oxide film 113 may be formed after the dopant 155 is deposited. In consideration of stability of deposition of the dopant 155, it is desirable that before the oxide film 113 is formed, the dopant 55 is deposited and additionally annealing is performed.

It is desirable to use the semiconductor substrate 110a formed by growing a $Si_{1-x}Ge_x$ epitaxial layer on a Si substrate. Due to lattice mismatching, the thickness of $Si_{1-x}Ge_x$ should be enough, for example, 100 nm, for a well relaxed $Si_{1-x}Ge_x$ layer.

Figure 21B:
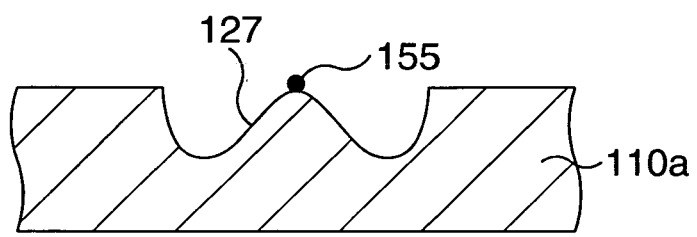
Figure 21C:
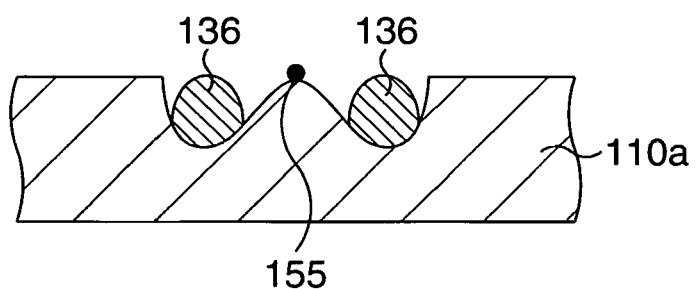

Subsequently, as shown in FIG. 21B, the oxide film 113 is removed. As a result, a ring-shaped groove 127 is formed and a dot-shaped pit (not shown) are formed. Note that the removal of the oxide film 113 needs to be performed on condition that the dopant 155 is not detached. Moreover, in order to prevent the dopant 155 from being detached, some thermal treatment may be performed to diffuse the dopant 155 into the semiconductor substrate 110a including the $Si_{1-x}Ge_x$ layer before the oxide film 113 is removed. The oxide film 113 can be removed, for example, by chemical etching, ultrasonic cleaning with water, a treatment with atomic hydrogen in a vacuum, or the like.

Thereafter, as shown in FIG. 21C and FIG. 23, semiconductor films 136 (Si films, for example) are epitaxially grown in the groove 127 and the dot-shaped pit.

Figure 21D:
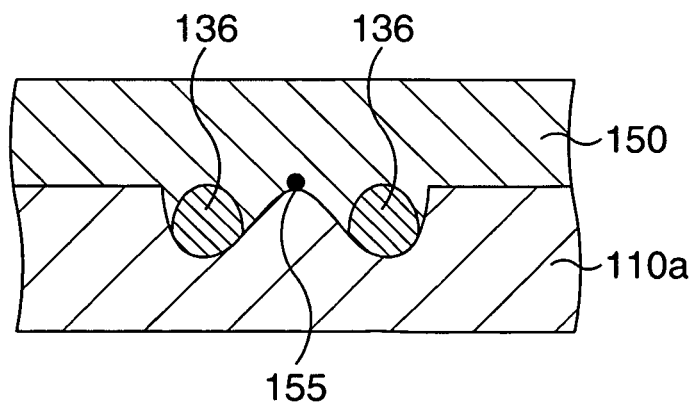

Then, as shown in FIG. 21D, by forming a capping layer 150 which covers the semiconductor films 136 and the semiconductor substrate 110a, the quantum device is finished.

According to this manufacturing method, the paramagnetic or ferromagnetic quantum ring 101 can be obtained. The use of such a quantum ring 101 makes it possible to obtain a nano-scale device which shows an Arharanov-Bohm effect.

Moreover, the quantum ring 101 of almost the same size as the quantum dot 103, whose diameter is approximately 50 nm or less can be obtained. For example, even if a generally used AFM tip is adopted, the ring diameter can be approximately 20 nm. Moreover, if a specially fine tip made of a carbon nano-tube or the like is used, a diameter of approximately 10 nm is also possible. A size variation of less than 5% is also possible.

Further, in this manufacturing method, by controlling the position of the tip 22, the quantum ring 101 and the quantum dot 103 can be formed at desired positions of the semiconductor substrate 110a. Furthermore, the size and shape of the oxide film 113 change according to the humidity in the atmosphere, the potential difference between the tip 22 and the semiconductor substrate 110a, and the growth time. These three factors can be easily controlled. The thickness of the semiconductor film 136 can be also easily controlled. Hence, not only the size of the quantum dot 103 but also the size of the quantum ring 101 can be easily controlled.

The quantum device can be manufactured also by the following method. FIG. 22A to FIG. 22D are sectional views showing another manufacturing method of the quantum device step by step.

Figure 22A:
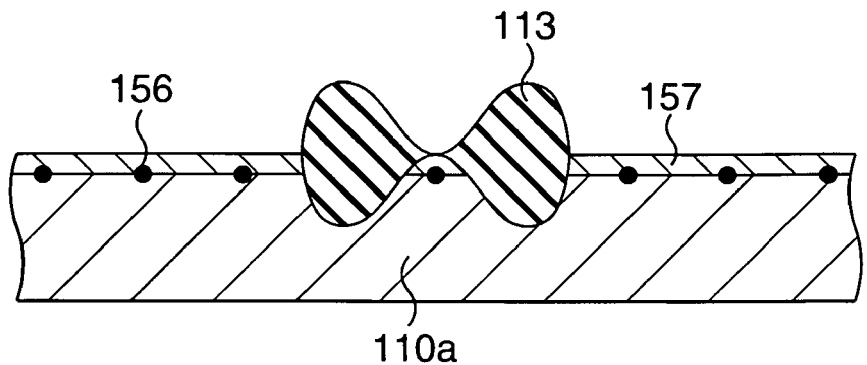
FIG. 22A to FIG. 22D are sectional views showing another method of manufacturing the quantum device.

In this method, first, as shown in FIG. 22A, dopants 156 in very small quantities, for example, the $^{31}$P atoms are incorporated into the surface of the semiconductor substrate 110a, by δ-doping, for example. At this time, doping conditions are adjusted so that only the single atom dopant 156 exists at a position where the quantum ring 101 is to be formed. Then, an epitaxial layer 157 such a SiGe layer with a thickness approximately between 1 nm and 2 nm is formed. Thereafter, also as shown in FIG. 22A, an oxide film 113 is formed in the same manner as in the aforementioned method.

A dot-shaped oxide film (not shown) is formed in a region where a quantum dot 103 is to be formed before or after the oxide film 113 is formed.

Figure 22B:
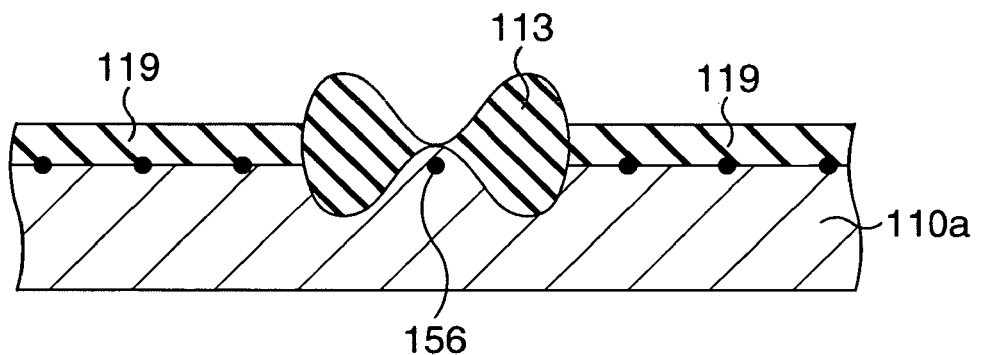

Subsequently, the tip 22 is moved away from the semiconductor substrate 110a, and while scanning the tip 22, an oxide film 119 is formed around the oxide film 113 as shown in FIG. 22B. Namely, the oxide film 119 is formed on the entire surface except the center of the oxide film 113. Similarly to the oxide film 113, the oxide film 119 is formed by an oxidation reaction accompanying the decomposition of $H_2O$ in the atmosphere. The thickness of the oxide film 119 is thicker than that of the epitaxial layer 157. Note that the distance from a bottom portion of the oxide film 113 to a lower surface of the oxide film 119 is sufficiently secured. Incidentally, in FIG. 22B, to simplify the figure, the remaining epitaxial layer 157 is shown as being united with the semiconductor substrate 110a.

Figure 22C:
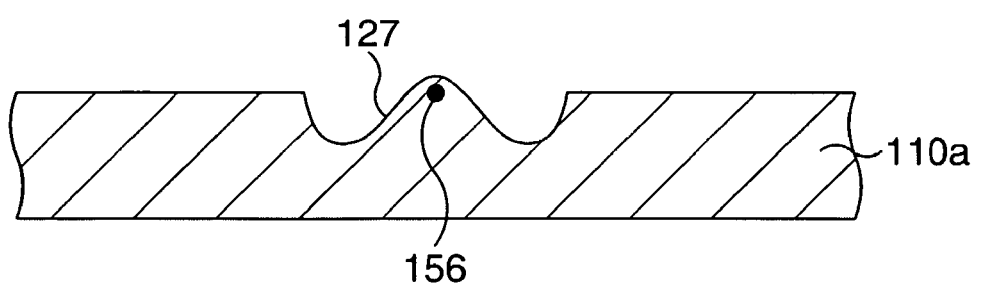

Thereafter, as shown in FIG. 22C, by removing the oxide films 113 and 119 in the same manner as in the aforementioned method, the groove 127 and a dot-shaped pit (not shown) are formed. As a result, the dopants 156 are removed except that existing in a center portion of the groove 127.

Figure 22D:
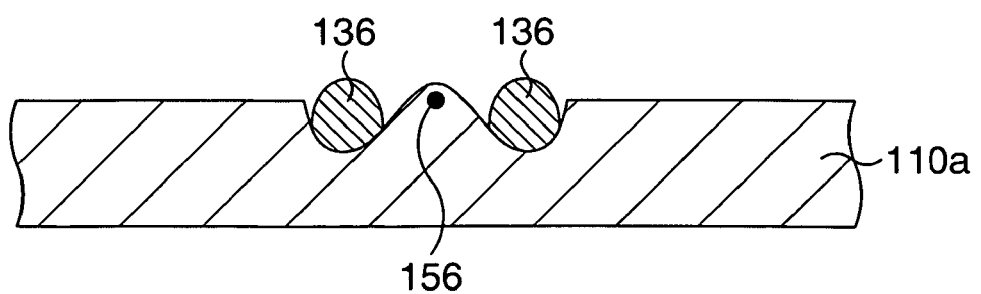

Subsequently, as shown in FIG. 22D, semiconductor films 136 (Si films, for example) are epitaxially grown in the groove 127 and the dot-shaped pit.

Then, the quantum ring device is finished by forming a capping layer (not shown in FIG. 22D) in the same manner as in the aforementioned method.

Also according to this method, the same effect as in the aforementioned method can be obtained.

Figure 24A:
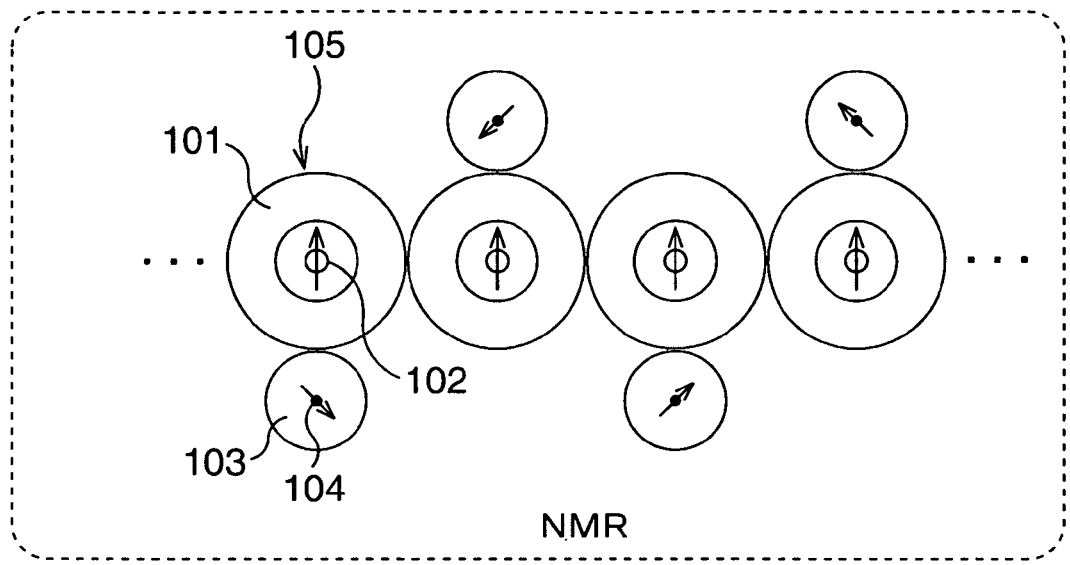
FIG. 24A to FIG. 24C are schematic views showing an embodiment in which the placement of quantum dots 103 is changed.
Figure 24B:
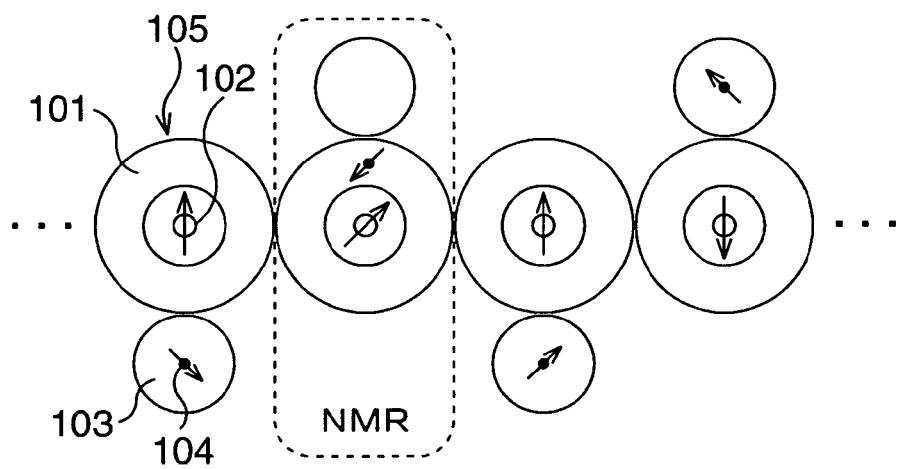
Figure 24C:
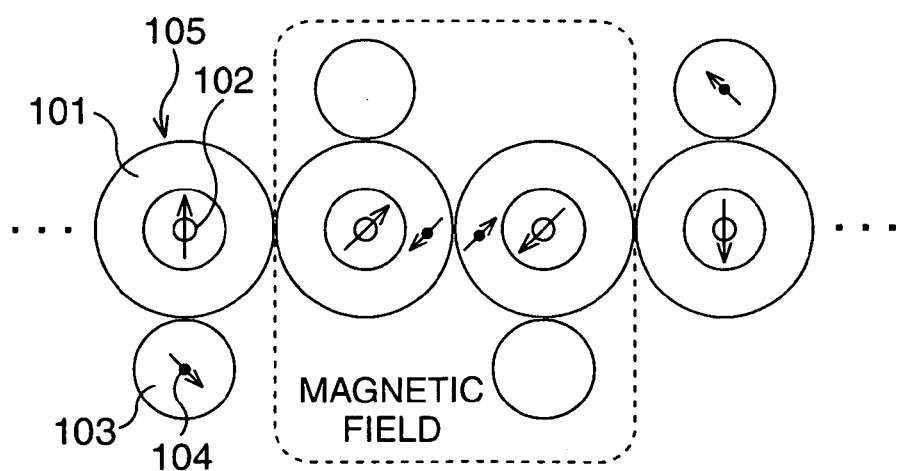

Incidentally, there may be weak interaction between the electrons 104 in the quantum dots 103 of the adjacent two qubits 105. In this case, operability degrades. If there is such a possibility, as shown in FIG. 24A to FIG. 24C, it is desirable that in the adjacent qubits 105, the quantum dots 103 be placed on opposite sides with respect to a line on which the quantum rings 101 each surrounding one $^{31}P$ atom 102 are arranged. FIG. 24A shows a stand-by state, FIG. 24B shows a state in which a manipulation for the single qubit 105 is performed, and FIG. 24C shows a state in which a manipulation for the adjacent two qubits 105 is performed.

According to the present invention, a quantum ring of a desired size can be formed at a desired position. Hence, it is suitable for various uses including a quantum computer.

Further, according to the present invention, even in a quantum device in a solid state, a quantum ring and a quantum dot are adjacent to each other so that a nuclear spin can be easily controlled. For example, if an electron exits in the quantum ring, hyperfine interaction functions between the nuclear spin and an electron spin. If the electron is moved into the quantum dot, the hyperfine interaction cannot function. Since the rotation of the nuclear spin can be controlled, for example, based on an NMR frequency, the control is easy. Moreover, the movement of the electron can be controlled by an optical pulse, so that the occurrence of decoherence can be reduced. Further, this structure can be formed easily using an AFM tip or the like.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a quantum device, comprising the steps of:
    bringing a tip of an atomic force microscope to which a negative bias is applied into contact with a surface of a semiconductor substrate to form a ring-shaped oxide film on the surface of the semiconductor substrate in an atmosphere containing water;
    forming a ring-shaped groove in the surface of the semiconductor substrate by removing the oxide film; and
    growing a semiconductor film in the groove.

2. The manufacturing method of the quantum device according to claim 1, wherein in said step of forming the oxide film, a portion of the semiconductor substrate which the tip touches is protected from oxidation.

3. The manufacturing method of the quantum device according to claim 1, wherein the semiconductor film is epitaxially grown.

4. The manufacturing method of the quantum device according to claim 1, wherein said step of removing the oxide film comprises the step of subjecting the oxide film to chemical etching.

5. The manufacturing method of the quantum device according to claim 1, wherein said step of removing the oxide film comprises the step of subjecting the oxide film to ultrasonic cleaning with water.

6. The manufacturing method of the quantum device according to claim 1, wherein said step of removing the oxide film comprises the step of subjecting the oxide film to a treatment with atomic hydrogen in a vacuum.

7. The manufacturing method of the quantum device according to claim 1, further comprising the step of depositing a single impurity atom on the surface of the semiconductor substrate before said step of forming the oxide film, the oxide film being formed so that the impurity atom is located at a center thereof.

8. The manufacturing method of the quantum device according to claim 1, further comprising the step of depositing a single impurity atom on a center of the oxide film between said step of forming the oxide film and said step of removing the oxide film.

9. The manufacturing method of the quantum device according to claim 7, further comprising the step of diffusing the impurity atom into the semiconductor substrate by a thermal treatment after said step of depositing the impurity atom.

10. The manufacturing method of the quantum device according to claim 7, wherein one selected from the group consisting of Si, Be, Fe and Co is deposited as the impurity atom.

11. The manufacturing method of the quantum device according to claim 1, further comprising the steps of:
    introducing impurity atoms into the surface of the semiconductor substrate before said step of forming the oxide film; and
    oxidizing a portion around the oxide film between said step of forming the oxide film and said step of removing the oxide film,
    in said step of forming the oxide film, the oxide film being formed so that one of the impurity atoms is located in a center thereof, and
    in said step of removing the oxide film, the oxide film and the oxidized portion therearound being removed.

12. A manufacturing method of a quantum device, comprising the steps of:
  introducing impurity atoms into a surface of a semiconductor substrate;
  bringing a tip of an atomic force microscope to which a negative bias is applied into contact with the surface of the semiconductor substrate to form a ring-shaped oxide film and a plurality of dot-shaped oxide films on the surface of the semiconductor substrate in an atmosphere containing water;
  oxidizing portions around the ring-shaped oxide film and the dot-shaped oxide films;
  forming a ring-shaped groove and dot-shaped pits in the surface of the semiconductor substrate by removing the ring-shaped oxide film and the dot-shaped oxide films and removing the oxidized portions therearound; and
  growing semiconductor films in the groove and the pits.

13. The manufacturing method of the quantum device according to claim 1, wherein a diameter of the ring-shaped oxide is 50 nm or less.

14. The manufacturing method of the quantum device according to claim 13, wherein a diameter of the ring-shaped oxide film is 20 nm or less.

15. The manufacturing method of the quantum device according to claim 1, wherein as the tip, a tip made of a carbon nano-tube is used, and a diameter of the ring-shaped oxide film is 10 nm or less.

16. The manufacturing method of the quantum device according to claim 1, wherein as the semiconductor substrate and the semiconductor film, those made of a compound semiconductor are used, respectively.

17. A controlling method of a quantum device comprising a qubit which includes a quantum ring, a single nuclear spin surrounded by the quantum ring, and a quantum dot adjacent to the quantum ring, said controlling method comprising:
  moving an electron which exists in the quantum ring into the quantum dot by applying an optical pulse to the qubit to cause optical excitation.

18. The controlling method of the quantum device according to claim 17, wherein the qubit contains SiGe.

19. The controlling method of the quantum device according to claim 17, wherein the nuclear spin is that of a $^{31}P$ atom.

20. The controlling method of the quantum device according to claim 17, further comprising:
  returning the electron in the quantum dot into the quantum ring by applying an optical pulse to the qubit to cause optical excitation; and
  making hyperfine interaction function between a spin of the electron in the quantum ring and the nuclear spin to rotate the nuclear spin.

21. The controlling method of the quantum device according to claim 20, wherein said step of rotating the nuclear spin comprises the step of applying a pulse with a resonant frequency to the qubit.

22. The controlling method of the quantum device according to claim 17, wherein the quantum device comprises a plurality of the qubits, and respective quantum rings of the plurality of qubits are placed side by side on one line, said controlling method further comprising, for the adjacent two out of the plurality of qubits, the steps of:
  returning electrons in the quantum dots into the quantum rings; and
  making exchange interaction function between spins of two electrons in the quantum rings to rotate the nuclear spins.

23. The controlling method of the quantum device according to claim 22, wherein said step of rotating the nuclear spins comprises the step of applying a magnetic field to the two qubits.

24. A manufacturing method of a quantum device, comprising the steps of:
  bringing a tip of an atomic force microscope to which a negative bias is applied into contact with a surface of a semiconductor substrate to form a ring-shaped oxide film and a dot-shaped oxide film adjacent to each other on the surface of the semiconductor substrate in an atmosphere containing water;
  depositing a single impurity atom on a center of the ring-shaped oxide film;
  forming a ring-shaped groove and a dot-shaped pit in the surface of the semiconductor substrate by removing the ring-shaped oxide film and the dot-shaped oxide film; and
  forming a quantum ring and a quantum dot by growing semiconductor films in the groove and the dot.

25. A manufacturing method of a quantum device, comprising the steps of:
  introducing impurity atoms into a surface of a semiconductor substrate;
  bringing a tip of an atomic force microscope to which a negative bias is applied into contact with the surface of the semiconductor substrate to form a ring-shaped oxide film and a dot-shaped oxide film adjacent to each other on the surface of the semiconductor substrate in an atmosphere containing water;
  oxidizing portions around the ring-shaped oxide film and the dot-shaped oxide film;
  forming a ring-shaped groove and a dot-shaped pit in the surface of the semiconductor substrate by removing the ring-shaped oxide film and the dot-shaped oxide film and removing the oxidized portions therearound; and
  forming a quantum ring and a quantum dot by growing semiconductor films in the groove and the pit.

26. The manufacturing method of the quantum device according to claim 24, wherein a plurality of qubits each comprising the quantum ring and the quantum dot are formed simultaneously so that the quantum rings are adjacent to each other.

27. The manufacturing method of the quantum device according to claim 25, wherein a plurality of qubits each comprising the quantum ring and the quantum dot are formed simultaneously so that the quantum rings are adjacent to each other.

* * * * *